(12) United States Patent
Yamazaki et al.

(10) Patent No.: US 8,421,067 B2
(45) Date of Patent: Apr. 16, 2013

(54) OXIDE SEMICONDUCTOR DEVICE

(75) Inventors: Shunpei Yamazaki, Tokyo (JP);
Masashi Tsubuku, Kanagawa (JP);
Kengo Akimoto, Kanagawa (JP);
Miyuki Hosoba, Kanagawa (JP);
Junichiro Sakata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 12 days.

(21) Appl. No.: 12/846,572

(22) Filed: Jul. 29, 2010

(65) Prior Publication Data

US 2011/0024740 A1    Feb. 3, 2011

(30) Foreign Application Priority Data

Jul. 31, 2009    (JP) ................. 2009-180156

(51) Int. Cl.
*H01L 29/12*    (2006.01)

(52) U.S. Cl.
USPC .................. 257/43; 257/E33.064

(58) Field of Classification Search .......... 257/43, 257/E29.296, E21.476, 59, 87, E33.064
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |

(Continued)

FOREIGN PATENT DOCUMENTS

| | | |
|---|---|---|
| EP | 1 737 044 A1 | 12/2006 |
| EP | 1 770 788 A2 | 4/2007 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Nikolay Yushin
(74) *Attorney, Agent, or Firm* — Fish & Richardson P.C.

(57) ABSTRACT

A semiconductor device having a structure which enables sufficient reduction in parasitic capacitance is provided. In addition, the operation speed of thin film transistors in a driver circuit is improved. In a bottom-gate thin film transistor in which an oxide insulating layer is in contact with a channel formation region in an oxide semiconductor layer, a source electrode layer and a drain electrode layer are formed in such a manner that they do not overlap with a gate electrode layer. Thus, the distance between the gate electrode layer and the source electrode layer and between the gate electrode layer and the drain electrode layer are increased; accordingly, parasitic capacitance can be reduced.

23 Claims, 35 Drawing Sheets

U.S. PATENT DOCUMENTS

| | | | |
|---|---|---|---|
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,642,038 B2 | 1/2010 | Fugii |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,148,779 B2 | 4/2012 | Jeong et al. |
| 8,188,480 B2 | 5/2012 | Itai |
| 8,203,143 B2 | 6/2012 | Imai |
| 8,222,092 B2 | 7/2012 | Yamazaki et al. |
| 2001/0046027 A1 | 11/2001 | Tai et al. |
| 2002/0056838 A1 | 5/2002 | Ogawa |
| 2002/0075423 A1 | 6/2002 | Fujino |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0221203 A1 | 10/2005 | Fugii |
| 2005/0275038 A1* | 12/2005 | Shih et al. ............. 257/382 |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0006833 A1 | 1/2010 | Ha et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051943 A1 | 3/2010 | Fugii |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0140612 A1 | 6/2010 | Omura et al. |
| 2010/0163868 A1 | 7/2010 | Yamazaki et al. |
| 2010/0283049 A1 | 11/2010 | Sato et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0193083 A1 | 8/2011 | Kim et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |

FOREIGN PATENT DOCUMENTS

| | | |
|---|---|---|
| EP | 1 995 787 A2 | 11/2008 |
| EP | 1 998 373 A2 | 12/2008 |
| EP | 1 998 374 A2 | 12/2008 |
| EP | 1 998 375 A2 | 12/2008 |
| EP | 2 226 847 A2 | 9/2010 |
| GB | 2 153 589 A | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-357586 A | 12/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

| | | | |
|---|---|---|---|
| JP | 2004-273732 A | 9/2004 | |
| JP | 2005-311325 A | 11/2005 | |
| JP | 2007-073559 A | 3/2007 | |
| JP | 2007-096055 A | 4/2007 | |
| JP | 2007-123861 A | 5/2007 | |
| JP | 2007-220819 A | 8/2007 | |
| JP | 2008-535205 A | 8/2008 | |
| JP | 2009-021612 A | 1/2009 | |
| JP | 2009-231613 A | 10/2009 | |
| JP | 2010-016347 A | 1/2010 | |
| JP | 2010-040552 A | 2/2010 | |
| JP | 2010-067954 A | 3/2010 | |
| WO | 2004/114391 A1 | 12/2004 | |
| WO | 2007/089048 A2 | 8/2007 | |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono. H. "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIR1M Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

International Search Report, PCT Application No. PCT/JP2010/061734, dated Oct. 12, 2010, 2 pages.

Written Opinion, PCT Application No. PCT/JP2010/061734, dated Oct. 12, 2010, 5 pages.

Masaya Nakayama et al.; "17a-TL-8 Effect of GaO Layer on IGZO-TFT Channel"; Extended Abstracts (The 57th Spring Meeting 2010); The Japan Society of Applied Physics and Related Societies; Mar. 17, 2010; p. 21-008, with translation.

Hye Dong Kim et al.; "22.1: Invited Paper: Technological Challenges for Large-Size AMOLED Display"; SID Digest '08 : SID International Symposium Digest of Technical Papers; May 20, 2008; pp. 291-294; vol. 39, No. 1.

Michael Quirk et al.; Semiconductor manufacturing technology; 2001; pp. 314-320; Prentice-Hall, Inc.

* cited by examiner

FIG. 4A1
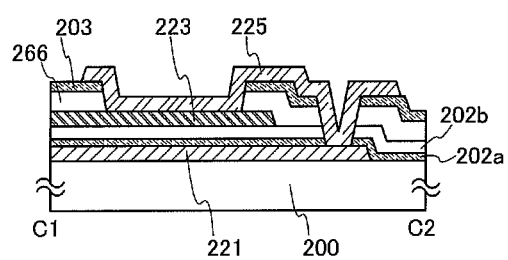
FIG. 4A2
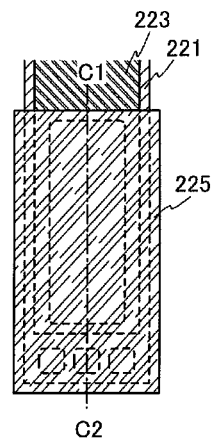
FIG. 4B1
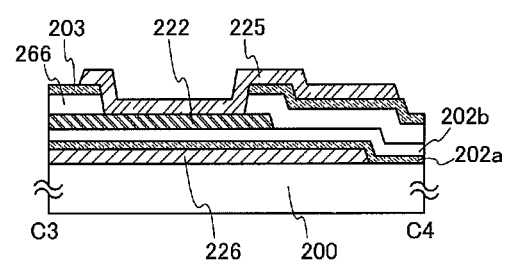
FIG. 4B2
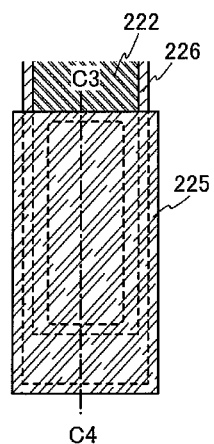

FIG. 8A1
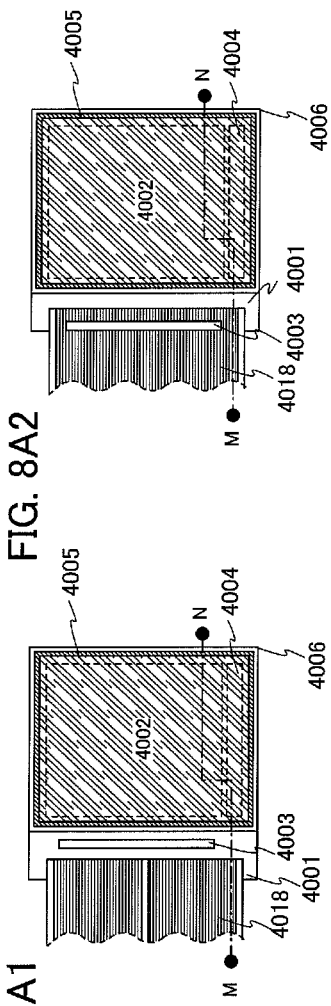
FIG. 8A2
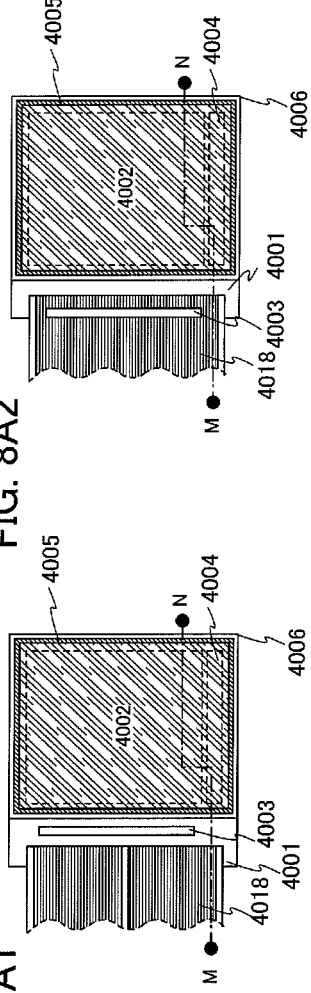
FIG. 8B
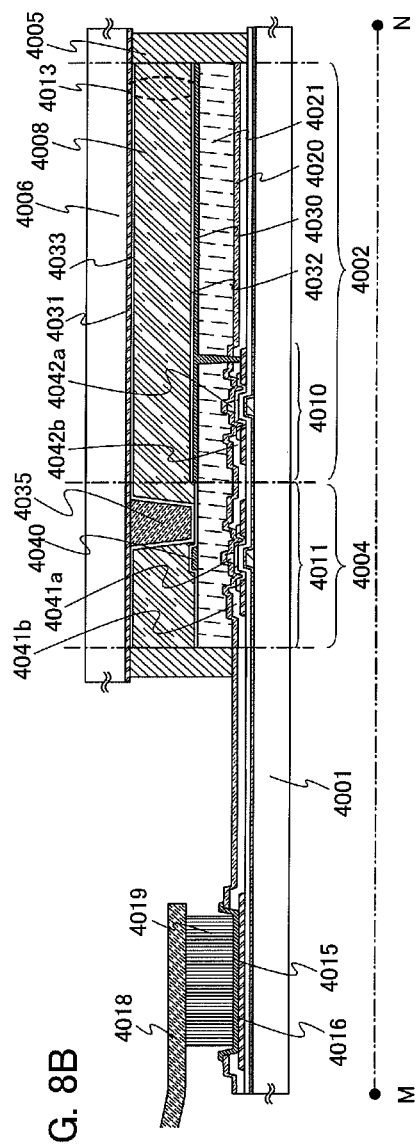

OXIDE SEMICONDUCTOR DEVICE

TECHNICAL FIELD

The present invention relates to a semiconductor device using an oxide semiconductor and a manufacturing method thereof.

Note that the semiconductor device in this specification refers to all the devices which can operate by using semiconductor characteristics, and an electro-optical device, a semiconductor circuit, and an electronic device are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide variety of electronic devices such as ICs or electro-optical devices, and their development especially as switching elements for an image display device has been accelerated. Various metal oxides are used for a variety of applications. Indium oxide is a well-known material and is used as a transparent electrode material which is necessary for liquid crystal displays and the like.

Some metal oxides have semiconductor characteristics. The examples of such metal oxides having semiconductor characteristics include tungsten oxide, tin oxide, indium oxide, and zinc oxide. A thin film transistor in which a channel formation region is formed using such metal oxide having semiconductor characteristics has been known (Patent Documents 1 and 2).

[Patent Document 1] Japanese Published Patent Application No. 2007-123861

[Patent Document 2] Japanese Published Patent Application No. 2007-96055

DISCLOSURE OF INVENTION

In the case where a thin film transistor is manufactured over an insulating surface, a gate insulating layer is provided between a gate electrode and a source electrode which is different in potential from the gate electrode. Thus, a capacitor is formed with the gate insulating layer serving as a dielectric. This capacitance is referred to as parasitic capacitance and may cause distortion of signal waveforms. In addition, when the parasitic capacitance is large, delay of transmission of a signal may be caused.

In addition, an increase in parasitic capacitance will lead to an increase in power consumption or an increase in leakage current which flows when the thin film transistor is OFF.

An object of an embodiment of the present invention is to provide a semiconductor device having a structure which enables sufficient reduction in parasitic capacitance.

In the case where a driver circuit is formed over an insulating surface, it is preferable that the operation speed of a thin film transistor included in the driver circuit be high.

Another object of one embodiment of the present invention is to improve the operation speed of the thin film transistor in the driver circuit.

In a bottom-gate thin film transistor, a source electrode layer and a drain electrode layer are formed in such a manner that they do not overlap with a gate electrode layer.

In the bottom-gate thin film transistor, an oxide insulating layer is formed to be in contact with a region of an oxide semiconductor layer which overlaps with the gate electrode layer. Thus, a channel formation region is selectively formed in a region of the oxide semiconductor layer which is in contact with the oxide insulating layer.

In the bottom-gate thin film transistor, the source electrode layer and the drain electrode layer are formed in such a manner that they do not overlap with the gate electrode layer. Thus, the distance between the gate electrode layer and the source electrode layer and between the gate electrode layer and the drain electrode layer are increased; accordingly, parasitic capacitance can be reduced. Although this will also increase the distance between the source electrode layer and the drain electrode layer, the channel formation region can be selectively formed in a region of the oxide semiconductor layer which is in contact with the oxide insulating layer, whereby the parasitic capacitance of the thin film transistor can be reduced while the channel length is kept small.

By reducing the parasitic capacitance of the thin film transistor, distortion of signal waveforms and delay of signal transmission is reduced, and an increase in leakage current and power consumption can be suppressed. In addition, a short channel length will lead to high-speed operation of the thin film transistor. In addition, with use of the thin film transistor operating at high speed, integration density of the circuits is improved.

One embodiment of the present invention disclosed in this specification is a semiconductor device which includes a gate electrode layer over an insulating surface; a gate insulating layer over the gate electrode layer; a source electrode layer and a drain electrode layer over the gate insulating layer; an oxide semiconductor layer over the gate insulating layer and parts of the source electrode layer and the drain electrode layer; an oxide insulating layer over the oxide semiconductor layer; and a protective insulating layer over the oxide insulating layer and the oxide semiconductor layer. The oxide semiconductor layer includes a channel formation region over the gate electrode layer. The source electrode layer and the drain electrode layer do not overlap with the gate electrode layer. Side surfaces of the source electrode layer and the drain electrode layer are in contact with parts of the oxide semiconductor layer. The oxide insulating layer is in contact with the channel formation region in the oxide semiconductor layer. The protective insulating layer is in contact with a part of the oxide semiconductor layer.

With the above structure, at least one of the above problems can be resolved.

One embodiment of the present invention to realize the above structure is a method for manufacturing a semiconductor device which includes the steps of forming a gate electrode layer over an insulating surface; forming a gate insulating layer over a gate electrode layer; forming a source electrode layer and a drain electrode layer over the gate insulating layer in such a manner that the source electrode layer and the drain electrode layer do not overlap with the gate electrode layer; forming an oxide semiconductor layer over the gate insulating layer, the oxide semiconductor layer overlapping with the gate electrode layer, a part of the source electrode layer, and a part of the drain electrode layer; performing a heat treatment for dehydrating or dehydrogenating the oxide semiconductor layer forming an oxide insulating layer over the oxide semiconductor layer, the source electrode layer, and the drain electrode layer without exposing to air after performing the heat treatment, the oxide insulating layer being in contact with a first region of the oxide semiconductor layer; and forming a protective insulating layer over the oxide semiconductor layer and the oxide insulating layer, the protective insulating layer being in contact with a second region and a third region of the oxide semiconductor layer.

Note that it is preferable that the oxide insulating layer cover the opposite ends of the oxide semiconductor layer in the channel length direction. In addition, it is preferable that the oxide insulating layer cover outer end portions of the source electrode layer and the drain electrode layer in the channel length direction. In addition, it is preferable that the oxide insulating layer be formed using a silicon oxide film, an aluminum oxide film, or an aluminum oxynitride film. In addition, it is preferable that the protective insulating layer be formed using a silicon nitride film or an aluminum nitride film. In addition, it is preferable that the width of the channel formation region in the channel length direction be smaller than the width of the gate electrode layer in the channel length direction.

In addition, the source electrode layer and the drain electrode layer may have a single-layer or stacked-layer structure including a film including an element selected from Al, Cr, Cu, Ta, Ti, Mo, or W as its main component or an alloy film of any of the elements. In addition, the source electrode layer and the drain electrode layer may be formed of indium oxide, an indium oxide-tin oxide alloy, an indium oxide-zinc oxide alloy, or zinc oxide.

Using the oxide semiconductor in this specification, a thin film expressed by $InMO_3(ZnO)_m$ (m>0) is used, and a thin film transistor using the thin film as an oxide semiconductor layer is manufactured. Note that M represents one or more metal elements selected from Ga, Fe, Ni, Mn, and Co. For example, M may be Ga or may include the above metal element in addition to Ga; for example, M may be Ga and Ni or Ga and Fe. Moreover, in the above oxide semiconductor, in some cases, a transition metal element such as Fe or Ni or oxide of the transition metal is included as an impurity element in addition to a metal element included as M. In this specification, among the oxide semiconductor layers whose composition formulas are represented by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As a metal oxide applied to the oxide semiconductor layers, any of the following oxide semiconductors can be applied besides the above: an In—Sn—Zn—O-based, an In—Al—Zn—O-based, a Sn—Ga—Zn—O-based, an Al—Ga—Zn—O-based, a Sn—Al—Zn—O-based, an In—Zn—O-based, a Sn—Zn—O-based, an Al—Zn—O-based, an In—O-based, a Sn—O-based, and Zn—O-based metal oxide. Silicon oxide may be included in the oxide semiconductor layer formed using the above metal oxide.

In the case where heat treatment in an inert gas atmosphere of nitrogen or a rare gas (such as argon or helium) is performed, the oxide semiconductor layer is placed in an oxygen-deficient state by the heat treatment and becomes a low-resistant oxide semiconductor layer, that is, an N-type (N$^-$-type) oxide semiconductor layer. Then, the oxide semiconductor layer is placed in an oxygen-excess state by the formation of an oxide insulating film which is in contact with the oxide semiconductor layer. Thus, the oxide semiconductor layer is changed into a high-resistance oxide semiconductor layer, that is, an I-type oxide semiconductor layer. Accordingly, it is possible to manufacture and provide a semiconductor device including a highly reliable thin film transistor having favorable electric characteristics.

The above-mentioned heat treatment is performed in an inert gas atmosphere of nitrogen or a rare gas (such as argon or helium) at a temperature of 400° C. or higher and lower than a strain point of the substrate, preferably 420° C. or higher and 570° C. or lower. In this heat treatment, the oxide semiconductor layer undergoes dehydration or dehydrogenation, which results in the reduction of impurities such as moisture included in the oxide semiconductor layer.

The oxide semiconductor layer is subjected to the heat treatment for dehydration or dehydrogenation under a heat treatment condition that two peaks of water or at least one peak of water at around 300° C. is not detected even if TDS is performed at up to 450° C. on the dehydrated or dehydrogenated oxide semiconductor layer. Therefore, even if TDS is performed at up to 450° C. on a thin film transistor including the oxide semiconductor layer obtained under such dehydration or dehydrogenation condition, at least the peak of water at around 300° C. is not detected.

Cooling after the heat treatment is carried out so that the oxide semiconductor layer does not contact with water or hydrogen, which is achieved by performing the cooling in a furnace used for dehydration or dehydrogenation without exposure of the oxide semiconductor layer to air. When a thin film transistor is formed using the oxide semiconductor layer obtained by changing an oxide semiconductor layer into a low-resistant oxide semiconductor layer, that is, an N-type (N$^-$-type or the like) oxide semiconductor layer by dehydration or dehydrogenation and then changing the low-resistant oxide semiconductor layer into a high-resistance oxide semiconductor layer so as to be an I-type semiconductor layer, the threshold voltage of the thin film transistor can be positive voltage, so that a so-called normally-off switching element can be realized. It is desirable for a semiconductor device (a display device) that a channel be formed with a threshold voltage that is a positive value and as close to 0 V as possible. If the threshold voltage of the thin film transistor is negative, it tends to be normally on; in other words, current flows between the source electrode and the drain electrode even when the gate voltage is 0 V. In an active-matrix display device, electric characteristics of thin film transistors included in circuits are important and performance of the display device is dependent on the electric characteristics of the thin film transistors. Among the electric characteristics of the thin film transistors, a threshold voltage (Vth) is particularly important. If the threshold voltage value is high or is on the minus side, even when the field effect mobility is high, it is difficult to control the circuit. If a thin film transistor has a high threshold voltage value and a large absolute value of its threshold voltage, the thin film transistor cannot perform switching function and may be a load when the transistor is driven at low voltage. In the case of an n-channel thin film transistor, it is preferable that a channel be formed and drain current begins to flow after positive voltage is applied as a gate voltage. Such a transistor in which a channel is not formed unless the driving voltage is increased and a transistor in which a channel is formed and drain current flows even when negative voltage is applied are unsuitable for a thin film transistor used in a circuit.

Cooling after the heat treatment may be carried out after switching the gas used in heating to a different gas. For example, cooling is performed by using the furnace in which dehydration or dehydrogenation are performed and then by filling the furnace with a high-purity oxygen gas, a high-purity $N_2O$ gas, or ultra-dry air (with a dew point of −40° C. or lower, preferably −60° C. or lower) without exposure of the oxide semiconductor layer to air.

By using an oxide semiconductor film which is cooled slowly (or cooled) in an atmosphere that does not contain moisture (with a dew point of −40° C. or lower, preferably −60° C. or lower) after moisture contained in the film is reduced by heat treatment for dehydration or dehydrogenation, the electrical characteristics of a thin film transistor are improved and a high-performance thin film transistor which is suitable for mass production is realized.

In this specification, heat treatment in an inert gas atmosphere of nitrogen or a rare gas (such as argon or helium) is referred to as heat treatment for dehydration or dehydrogenation. In this specification, dehydrogenation does not only refer to elimination of $H_2$ by the heat treatment, but dehydration or dehydrogenation also refers to elimination of H, OH, and the like for convenience.

In the case where heat treatment is performed in an inert gas atmosphere of nitrogen or a rare gas (such as argon or helium), the oxide semiconductor layer is changed into an oxygen-deficient oxide semiconductor layer by the heat treatment so as to be a low-resistant oxide semiconductor layers, that is, an N-type (e.g., N⁻-type) oxide semiconductor layer.

Further, a region overlapping with the drain electrode layer is formed as a high-resistance drain region (also referred to as an HRD region) which is an oxygen-deficient region. In addition, a region overlapping with the source electrode layer is formed as a high-resistance source region (also referred to as an HRS region) which is an oxygen-deficient region.

Specifically, the carrier concentration of each of the high-resistance drain region is $1 \times 10^{18}/cm^3$ or higher and is at least higher than the carrier concentration of a channel formation region (lower than $1 \times 10^{18}/cm^3$). Note that the carrier concentration in this specification is a carrier concentration obtained by Hall Effect measurement at room temperature.

Then, the channel formation region is formed by placing at least a part of the oxide semiconductor layer which is dehydrated or dehydrogenated in an oxygen-excess state so as to have high resistance, that is, to be I-type. Note that as the treatment for placing the dehydrated or dehydrogenated oxide semiconductor layer in an oxygen-excess state, the following treatment is given, for example: deposition of an oxide insulating film which is in contact with the dehydrated or dehydrogenated oxide semiconductor layer by a sputtering method; heat treatment or heat treatment in an atmosphere containing oxygen, or cooling treatment in an oxygen atmosphere or in ultra-dry air (with a dew point of −40° C. or lower, preferably −60° C. or lower) after heat treatment in an inert gas atmosphere, after the deposition of the oxide insulating film; or the like.

In order to make at least a part (a part overlapping with the gate electrode layer) of the dehydrated or dehydrogenated oxide semiconductor layer serve as the channel formation region, the oxide semiconductor layer can be selectively placed into an oxygen-excess state so as to be a high-resistance layer, that is, an I-type oxide semiconductor layer.

Accordingly, it is possible to manufacture and provide a semiconductor device including a highly reliable thin film transistor having favorable electric characteristics.

Note that by forming a high-resistance drain region in a part of the oxide semiconductor layer which overlaps with the drain electrode layer, the reliability can be improved when a driver circuit is formed. Specifically, by forming the high-resistance drain region, a structure can be employed in which conductivity can be varied stepwise from the drain electrode layer to the high-resistance drain region and the channel formation region. Therefore, in the case where the thin film transistor operates with the drain electrode layer connected to a wiring for supplying a high power supply potential VDD, the high-resistance drain region serves as a buffer and a high electric field is not applied locally even if a high electric field is applied between the gate electrode layer and the drain electrode layer; thus, the withstand voltage of the transistor can be improved.

In addition, by forming the high-resistance drain region is formed in a part of the oxide semiconductor layer which overlaps with the drain electrode layer (or the source electrode layer), a reduction in leakage current in the channel formation region can be achieved when the driver circuit is formed. Specifically, by forming the high-resistance drain region, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance region on the drain electrode layer side to the channel formation region can be concentrated on the vicinity of the interface between the channel formation region and a gate insulating layer which has high resistance when the transistor is off. Thus, the amount of leakage current in a back channel portion (a part of a surface of the channel formation region which is apart from the gate electrode layer) can be reduced.

As a display device including a driver circuit, a light-emitting display device in which a light-emitting element is used and a display device in which an electrophoretic display element is used, which is also referred to as an electronic paper, are given in addition to a liquid crystal display device.

In the light-emitting display device in which a light-emitting element is used, a plurality of thin film transistors are included in a pixel portion, and in the pixel portion, there is a region where a gate electrode of a thin film transistor is connected to a source wiring or a drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

Since a thin film transistor is easily broken due to static electricity or the like, a protective circuit for protecting the thin film transistor for the pixel portion is preferably provided over the same substrate for a gate line or a source line. The protective circuit is preferably formed with a non-linear element including an oxide semiconductor layer.

By employing the above structure, a semiconductor device with sufficiently reduced parasitic capacitance and a short channel length which is capable of high-speed operation can be provided.

BRIEF DESCRIPTION OF DRAWINGS

FIGS. 4A1 to 4B2 are plan views and cross-sectional views according to one embodiment of the present invention.

FIGS. 8A1, 8A2, and 8B illustrate a semiconductor device.

BEST MODE FOR CARRYING OUT THE INVENTION

Figure 1A:
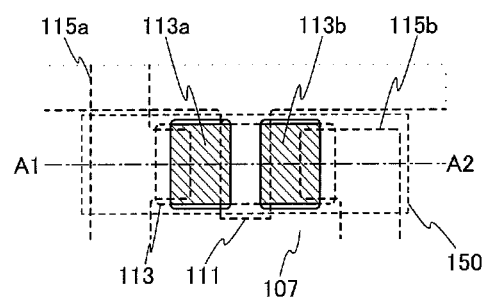
FIGS. 1A and 1B are a plan view and a cross-sectional view according to one embodiment of the present invention.

Hereinafter, embodiments of the present invention will be described in detail with reference to the drawings. Note that the present invention is not limited to the following description and it will be readily appreciated by those skilled in the art that modes and details can be modified in various ways. Accordingly, the present invention should not be construed as being limited to the description of the embodiments to be given below. Note that in the accompanying drawings of this specification, like components or components having like functions are denoted by the like reference numerals and repeated description thereof may be omitted.

Embodiment 1

Figure 1B:
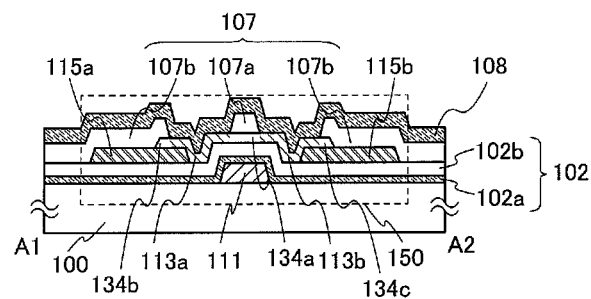

In this embodiment, an example of a structure of a semiconductor device will be described with reference to FIGS. 1A and 1B. FIG. 1A is a plan view of a thin film transistor 150. FIG. 1B is a cross-sectional view taken along line A1-A2 in FIG. 1A. The thin film transistor 150 has a kind of bottom-gate structure, which is also called a bottom contact (or inverted coplanar) structure.

As in FIGS. 1A and 1B, the thin film transistor 150 includes a gate electrode layer 111 over a substrate 100 with an insulating surface, a gate insulating layer 102 over the gate electrode layer 111, a source electrode layer 115a and a drain electrode layer 115b over the gate insulating layer 102, an oxide semiconductor layer 113 over the gate insulating layer 102 and the gate electrode layer 111, an oxide insulating layer 107 over the oxide semiconductor layer 113, and a protective insulating layer 108 over the oxide insulating layer 107 and the oxide semiconductor layer 113. Here, the source electrode layer 115a and the drain electrode layer 115b are formed in such a manner that they do not overlap with the gate electrode layer 111 and at least parts of their side surfaces are in contact with part of the oxide semiconductor layer 113. The oxide semiconductor layer 113 includes a channel formation region 134a over the gate electrode layer 111. The oxide insulating layer 107a is in contact with the channel formation region 134a in the oxide semiconductor layer 113. The protective insulating layer 108 is in contact with a part of the oxide semiconductor layer 113. Note that a region of the oxide insulating layer 107 which is in contact with the channel formation region 134a in the oxide semiconductor layer 113 is referred to as an oxide insulating layer 107a and the other region of the oxide insulating layer 107 is referred to as an oxide insulating layer 107b.

As described above, in the bottom-contact thin film transistor 150, the source electrode layer 115a and the drain electrode layer 115b are formed in such a manner that they do not overlap with the gate electrode layer 111, whereby the distance between the gate electrode layer 111 and the source electrode layer 115a and between the gate electrode layer 111 and the drain electrode layer 115b are increased. Thus, parasitic capacitance can be reduced.

In this manner, in the thin film transistor 150, distortion of signal waveforms and delay of signal transmission due to an increase in parasitic capacitance can be reduced, and an increase in leakage current and power consumption can be suppressed.

A region of the oxide semiconductor layer which is sandwiched, together with the gate insulating layer 102, between the oxide insulating layer 107a and the gate electrode layer 111 is referred to as a channel formation region. Thus, the channel length L of the thin film transistor 150 is equal to the width of the oxide insulating layer 107a in the channel length direction. Note that the channel length L of the thin film transistor 150 means the length of the oxide semiconductor layer at the interface with the oxide insulating layer 107a, i.e., the length of the base of the trapezoid which represents the oxide insulating layer 107a in the cross-sectional view of FIG. 1B.

The channel formation region 134a is a region of the oxide semiconductor layer 113 which is placed in an oxygen-excess state to become a high-resistance (I-type) region. The carrier concentration of the channel formation region 134a is less than $1 \times 10^{18}/cm^3$.

The width of the channel formation region 134a in the channel length direction is preferably smaller than the width of the gate electrode layer 111 in the channel length direction to provide a short channel length. A short channel length will lead to high-speed operation of the thin film transistor 150 and low power consumption. In particular, a short channel length is more preferable in the case where the thin film transistor 150 is included in a driver circuit which is required to operate at high speed.

Further, as in FIGS. 1A and 1B, the oxide semiconductor layer 113 includes a high-resistance source region 113a and a high-resistance drain region 113b in such a manner that the channel formation region 134a is provided therebetween. The high-resistance source region 113a and the high-resistance drain region 113b are formed in a region of the oxide semiconductor layer 113 which is not in contact with the oxide insulating layer 107, that is, the region of the oxide semiconductor layer 113 which is in contact with the protective insulating layer 108. In addition, the high-resistance source region 113a and the high-resistance drain region 113b in the oxide semiconductor layer 113 are respectively in contact with the source electrode layer 115a and the drain electrode layer 115b.

The high-resistance source region 113a and the high-resistance drain region 113b are regions of the oxide semiconductor layer 113 which are placed in an oxygen-deficient state to become low-resistance (N-type or N⁻-type) regions. The carrier concentration of the regions is $1\times10^{18}/cm^3$ or more.

By formation of the channel formation region 134a, the high-resistance source region 113a, and the high-resistance drain region 113b in the oxide semiconductor layer 113, the amount of leakage current in the channel formation region 134a can be reduced.

By providing the high-resistance source region 113a and the high-resistance drain region 113b in the thin film transistor 150, even when a high electric field is applied, the high-resistance source region 113a or the high-resistance drain region 113b serves as a buffer, so that the thin film transistor 150 is prevented from being supplied with a high electric field locally; thus the withstand voltage of the thin film transistor 150 can be improved.

In addition, as in FIGS. 1A and 1B, a first region 134b and a second region 134c are provided at the opposite ends of the oxide semiconductor layer 113 in the channel length direction. The first region 134b and the second region 134c are each formed in a region of the oxide semiconductor layer 113 which is in contact with the oxide insulating layer 107b. Like the channel formation region 134a, the first region 134b and the second region 134c are regions which are placed in an oxygen-excess state to become high-resistance (I-type) regions. Thus, a reduction in leakage current and parasitic capacitance can be achieved when the oxide semiconductor layer or a wiring which is different in potential from the oxide semiconductor layer are arranged to be close to each other. In terms of high integration, it is preferable especially in the driver circuit that a plurality of wirings and a plurality of oxide semiconductor layers be arranged at small distances therebetween. In such a driver circuit, it is effective to provide the first region 134b and the second region 134c to reduce leakage current and parasitic capacitance.

Although FIG. 1B illustrates a structure in which the first region 134b and the second region 134c are formed at the opposite ends in the channel length direction, there is no limitation on the structure. A structure in which the first region 134b and the second region 134c are formed in the peripheral region of the oxide semiconductor layer 113 may be employed.

The oxide semiconductor layer 113 can be formed using an In—Ga—Zn—O-based non-single-crystal film, or an oxide semiconductor film such as an In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, In—O-based, Sn—O-based, or Zn—O-based oxide semiconductor film. In the case where the oxide semiconductor film is formed by a sputtering method, it is preferable that film formation be performed with a target including $SiO_2$ at 2 wt % to 10 wt % inclusive so that $SiO_x$ (X>0) which inhibits crystallization is included in the oxide semiconductor film to suppress crystallization. The thickness of the oxide semiconductor layer is preferably 2 nm to 200 nm inclusive.

The oxide semiconductor is preferably an oxide semiconductor containing In, more preferably an oxide semiconductor containing In and Ga. In order to obtain an I-type (intrinsic) oxide semiconductor layer, dehydration or dehydrogenation is effective.

As the source electrode layer 115a and the drain electrode layer 115b, a metal conductive film can be used. As the material of the metal conductive film, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. It is needless to say that the metal conductive film may have a single-layer structure, a two-layer structure, or a stacked-layer structure including four or more layers. When a metal conductive film is used as the source electrode layer 115a and the drain electrode layer 115b, the resistance of wirings can be lowered.

Further, it is also possible to use a metal conductive film of, e.g., titanium, as the source electrode layer 115a and the drain electrode layer 115b so that oxygen is extracted from the high-resistance source region 113a and the high-resistance drain region 113b to form regions having a higher carrier concentration than the high-resistance source region 113a and the high-resistance drain region 113b at the interfaces between the source electrode layer 115a and the high-resistance source region 113a and between the drain electrode layer 115b and the high-resistance drain region 113b.

Further, a conductive film which transmits visible light can be used as the source electrode layer 115a and the drain electrode layer 115b. As a material for the conductive film which transmits visible light, for example, In—Sn—Zn—O-based, In—Al—Zn—O-based, Sn—Ga—Zn—O-based, Al—Ga—Zn—O-based, Sn—Al—Zn—O-based, In—Zn—O-based, In—Sn—O-based, Sn—Zn—O-based, Al—Zn—O-based, In—O-based, Sn—O-based, or Zn—O-based metal oxide can be given. Specifically, indium oxide, an indium oxide-tin oxide alloy, an indium oxide-zinc oxide alloy, or zinc oxide is preferable. In the case where the conductive film which transmits visible light is formed by a sputtering method, it is preferable that film formation be performed with a target including $SiO_2$ at 2 wt % to 10 wt % inclusive so that $SiO_x$ (X>0) which inhibits crystallization is included in the conductive film which transmits visible light to suppress crystallization. The thickness of the conductive film which transmits visible light is preferably 50 nm to 300 nm inclusive. If the source electrode layer 115a and the drain electrode layer 115b is formed using the conductive film which transmits visible light, the use of the thin film transistor 150 in the pixel portion can improve an aperture ratio.

Note that as a metal conductive film or conductive film which transmits visible light for forming the source electrode layer 115a and the drain electrode layer 115b, a film of a material which remains when the oxide semiconductor layer 113 is processed is preferably used.

In this specification, a film which transmits visible light refers to a film having a visible light transmittance of 75% to 100%; when the film has conductivity, the film is also referred to as a transparent conductive film. Further, a conductive film that is semi-transparent to visible light may be used as a metal oxide for the gate electrode layer, the source electrode layer, the drain electrode layer, the pixel electrode layer, or another electrode layer or another wiring layer. Semi-transparency to visible light means that the visible light transmittance is 50% to 75%.

Further, like the source electrode layer 115a and the drain electrode layer 115b, the gate electrode layer 111 can be formed using a metal conductive film or conductive film which transmits visible light.

The oxide insulating layer 107 has a thickness of at least 1 nm and is preferably formed using a silicon oxide film or an aluminum oxide film. For formation of the oxide insulating layer 107, a method in which impurities such as water or hydrogen are not mixed into the oxide insulating film, e.g., a sputtering method, may be employed as appropriate. By providing the oxide insulating layer 107, oxygen in the oxide insulating layer 107 is supplied to the oxide semiconductor layer 113. Thus, the channel formation region 134a can be selectively formed in a region of the oxide semiconductor layer 113 which is in contact with the oxide insulating layer 107a, and the first region 134b and the second region 134c can each be formed in a region of the oxide semiconductor layer 113 which is in contact with the oxide insulating layer 107b. In such a manner, the width of the channel formation region 134a in the channel length direction can be determined depending on the patterning of the oxide insulating layer 107a; therefore, the channel length can be easily shortened. A short channel length will lead to high-speed operation of the thin film transistor 150 and low power consumption. In particular, a short channel length is more preferable in the case where the thin film transistor 150 is included in a driver circuit which is required to operate at high speed.

Note that although the oxide insulating layer 107b is provided to overlap with the opposite ends of the oxide semiconductor layer 113 in the channel length direction in FIG. 1A, there is no limitation on the structure. The oxide insulating layer 107b may be formed to overlap with the entire peripheral region of the oxide semiconductor layer 113 so that the first region 134b and the second region 134c may be formed in the peripheral region of the oxide semiconductor layer 113.

In addition, it is preferable that the oxide insulating layer 107b also overlap with outer end portions of the source electrode layer 115a and the drain electrode layer 115b in the channel length direction. In such a structure, in the case where the thin film transistors 150 are integrated in the driver circuit and the like, the oxide insulating layer 107b and the protective insulating layer 108 are provided between the source and drain electrode layers 115a and 115b and a wiring over the protective insulating layer 108; accordingly, occurrence of parasitic capacitance or leakage current can be suppressed.

The protective insulating layer 108 does not include impurities such as moisture, hydrogen ions, or OH⁻ and is formed using an inorganic insulating film which prevents entry of these from the outside. For example, a silicon nitride film, an aluminum nitride film, a silicon nitride oxide film, or an aluminum oxynitride film is preferably used.

The gate insulating layer 102 preferably has a stacked-layer structure including a first gate insulating layer 102a and a second gate insulating layer 102b over the first gate insulating layer 102a, as illustrated in FIG. 1B. The first gate insulating layer 102a preferably has a thickness of 50 nm to 200 nm inclusive. The first gate insulating layer 102a is preferably formed using a silicon nitride film or a silicon nitride oxide film. The second gate insulating layer 102b preferably has a thickness of 50 nm to 300 nm inclusive. The second gate insulating layer 102b is preferably formed using a silicon oxide film or an aluminum oxide film.

Figure 7A:
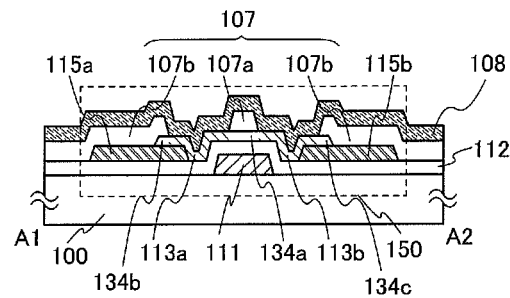
FIGS. 7A to 7C are cross-sectional views according to one embodiment of the present invention.
Figure 7B:
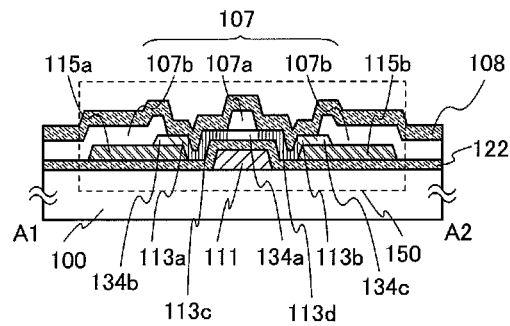
Figure 7C:
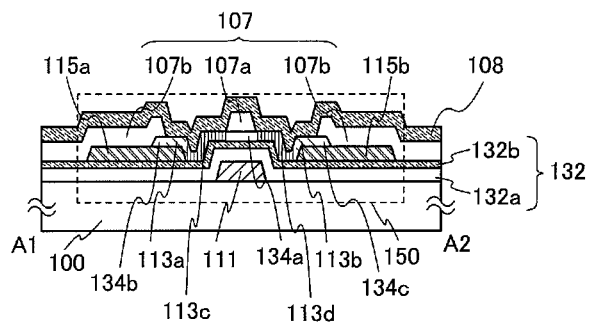

Note that the structure of the gate insulating layer is not limited to the above. FIGS. 7A to 7C illustrate examples of thin film transistors in which a gate insulating layer different from that in FIG. 1B is provided. In FIGS. 7A to 7C, components which are the same as those in FIG. 1B are denoted by the same reference numerals. As in FIG. 7A, a gate insulating layer 112 which is a single layer of a silicon oxide film or an aluminum oxide film having a thickness of 50 nm to 300 nm inclusive may be employed. As in FIG. 7B, a gate insulating layer 122 which is a single layer of a silicon nitride film or a silicon nitride oxide film which has a thickness of 50 nm to 200 nm inclusive may be employed. By forming the gate insulating layer to be a single layer as in these examples, a manufacturing process of the thin film transistor 150 can be simple.

Alternatively, as in FIG. 7C, a gate insulating layer 132 which has a stacked-layer structure including a first gate insulating layer 132a of a silicon oxide film or an aluminum oxide film having a thickness of 50 nm to 300 nm inclusive and a second gate insulating layer 132b of a silicon nitride film or a silicon nitride oxide film having a thickness of 50 nm to 200 nm inclusive over the first gate insulating layer 132a may be employed. In the thin film transistors in FIGS. 7B and 7C, a third region 113c and a fourth region 113d are each formed in a region of the oxide semiconductor layer 113 which is sandwiched between the protective insulating layer 108 formed of nitride and the gate insulating layer 122 or the second gate insulating layer 132b which are also formed of nitride. The third region 113c in the oxide semiconductor layer is formed between the channel formation region 134a and the high-resistance source region 113a. The fourth region 113d in the oxide semiconductor layer 113 is formed between the channel formation region 134a and the high-resistance drain region 113b. The third region 113c and the fourth region 113d can reduce off-current.

As described above, the gate insulating layer 102 can have a thickness of 100 nm to 500 nm inclusive and have a single-layer or stacked-layer structure including a silicon oxide film, a silicon nitride film, a silicon oxynitride film, a silicon nitride oxide film, or an aluminum oxide film.

As described above, in the bottom-gate thin film transistor, the source electrode layer and the drain electrode layer are formed in such a manner that they do not overlap with the gate electrode layer, whereby the distance between the gate electrode layer and the source electrode layer and between the gate electrode layer and the drain electrode layer are increased. In addition, a channel formation region with a short channel length is provided. Thus, a semiconductor device with sufficiently reduced parasitic capacitance and a short channel length which is capable of high-speed operation can be provided.

Note that the structure described in this embodiment can be combined with any of the structures described in the other embodiments as appropriate.

Embodiment 2

A mode of a manufacturing method for the semiconductor device described in Embodiment 1 will be described with reference to FIGS. 2A to 2E.

First, a conductive film or metal conductive film which transmits visible light is formed over the substrate 100 having an insulating surface, and then a first photolithography step is performed to form the gate electrode layer 111. Note that a resist mask may be formed by an ink jetting method. Formation of the resist mask by an ink jetting method needs no photomask; thus, manufacturing cost can be reduced.

Although there is no particular limitation on a substrate which can be used as the substrate 100 having an insulating surface, it is necessary that the substrate have at least enough heat resistance to withstand heat treatment performed later. For example, a glass substrate can be used as the substrate 100 having an insulating surface.

As a glass substrate, if the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example. Note that by containing a larger amount of barium oxide (BaO) than boric acid, a glass substrate which is heat-resistant and more practical can be obtained. Therefore, a glass substrate containing a larger amount of BaO than $B_2O_3$ is preferably used.

Note that a substrate formed of an insulator such as a ceramic substrate, a quartz substrate, or a sapphire substrate may be used instead of the above glass substrate. Alternatively, crystallized glass or the like may be used.

An insulating film serving as a base film may be provided between the substrate 100 and the gate electrode layer 111. The base film has a function of preventing diffusion of an impurity element from the substrate 100, and can be formed to have a single-layer or stacked-layer structure using one or more of a silicon nitride film, a silicon oxide film, a silicon nitride oxide film, and a silicon oxynitride film.

The gate electrode layer 111 can be formed of a material similar to the materials for the source electrode layer 115a and the drain electrode layer 115b described in Embodiment 1. The thickness of the gate electrode layer 111 is determined as appropriate within the range of 50 nm to 300 nm inclusive.

In the case where a light-transmitting conductive film is used, the light-transmitting conductive film is formed by a sputtering method, a vacuum evaporation method (e.g., an electron beam evaporation method), an arc discharge ion plating method, or a spray method. In the case of using a sputtering method, it is preferable that film formation be performed with a target including $SiO_2$ at 2 wt % to 10 wt % inclusive so that $SiO_x$ (X>0) which inhibits crystallization is included in the light-transmitting conductive film so that the light-transmitting conductive film may be prevented from being crystallized in heat treatment performed later for dehydration or dehydrogenation.

Then, the gate insulating layer 102 is formed over the gate electrode layer 111.

The gate insulating layer 102 can be formed to have a single-layer or stacked-layer structure of any of a silicon oxide layer, a silicon nitride layer, a silicon oxynitride layer, and a silicon nitride oxide layer by a plasma CVD method, a sputtering method, or the like. For example, a silicon oxynitride layer may be formed by a plasma CVD method using $SiH_4$, oxygen, and nitrogen as a film formation gas. The gate insulating layer 102 has a thickness of 100 nm to 500 nm inclusive. In the case of a stacked-layer structure, the first gate insulating layer 102a with a thickness of 50 nm to 200 nm inclusive and the second gate insulating layer 102b with a thickness from 5 nm to 300 nm inclusive are stacked in this order.

In this embodiment, the gate insulating layer 102 is formed by a plasma CVD method as a stacked-layer structure including the first gate insulating layer 102a of a silicon nitride film having a thickness of 100 nm and the second gate insulating layer 102b of a silicon oxide film having a thickness of 100 nm.

Figure 2A:
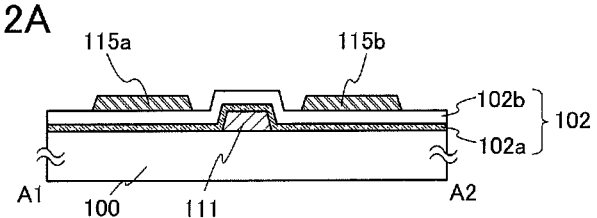
FIGS. 2A to 2E are cross-sectional views according to one embodiment of the present invention.

Then, a metal conductive film or a conductive film which transmits visible light is formed over the second gate insulating layer 102b, and then a second photolithography step is performed to form the source electrode layer 115a and the drain electrode layer 115b (see FIG. 2A). Here, the source electrode layer 115a and the drain electrode layer 115b are formed in such a manner that they do not overlap with the gate electrode layer 111. The source electrode layer 115a and the drain electrode layer 115b can be formed of a material similar to the materials for the source electrode layer 115a and the drain electrode layer 115b described in Embodiment 1.

In the case where a light-transmitting conductive film is used, the light-transmitting conductive film is formed by a sputtering method, a vacuum evaporation method (e.g., an electron beam evaporation method), an arc discharge ion plating method, or a spray method. The thickness of the source electrode layer 115a and the drain electrode layer 115b is determined as appropriate within the range of 50 nm to 300 nm inclusive. In the case of using a sputtering method, it is preferable that film formation be performed with a target including $SiO_2$ at 2 wt % to 10 wt % inclusive so that $SiO_x$ (X>0) which inhibits crystallization is included in the light-transmitting conductive film so that the light-transmitting conductive film may be prevented from being crystallized in heat treatment performed later for dehydration or dehydrogenation.

Note that a resist mask for forming the source electrode layer 115a and the drain electrode layer 115b may be formed by an ink jetting method. Formation of the resist mask by an ink jetting method needs no photomask; thus, manufacturing cost can be reduced.

Figure 2B:
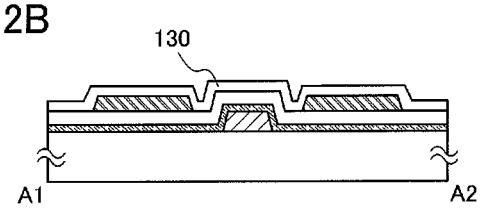
Figure 2C:
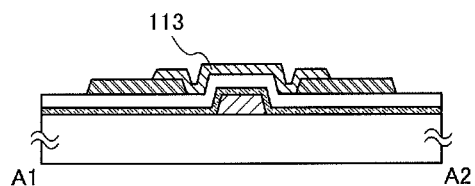

Then, an oxide semiconductor film 130 with a thickness of 2 nm to 200 nm inclusive is formed over the second gate insulating layer 102b, the source electrode layer 115a, and the drain electrode layer 115b (see FIG. 2B). The thickness is preferably 50 nm or less in order that the oxide semiconductor layer may be amorphous even when heat treatment for dehydration or dehydrogenation is performed after the oxide semiconductor film 130 is formed. A small thickness of the oxide semiconductor layer can suppress crystallization when heat treatment is performed after the oxide semiconductor layer is formed.

Note that before the oxide semiconductor film 130 is formed by a sputtering method, powdery substances (also referred to as particles or dust) which are generated at the time of the film formation and attached to a surface of the second gate insulating layer 102b are preferably removed by reverse sputtering in which an argon gas is introduced and plasma is generated. The reverse sputtering refers to a method in which an RF power source is used for application of voltage to a substrate in an argon atmosphere and plasma is generated in the vicinity of the substrate to modify the surface. Note that instead of an argon atmosphere, nitrogen, helium, oxygen, or the like may be used.

The oxide semiconductor film 130 is formed using an In—Ga—Zn—O-based non-single-crystal film, or an oxide semiconductor film such as an In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, In—O-based, Sn—O-based, or Zn—O-based oxide semiconductor film. In this embodiment, the oxide semiconductor film 130 is formed by a sputtering method with an In—Ga—Zn—O-based oxide semiconductor target. Alternatively, the oxide semiconductor film 130 can be formed by a sputtering method in a rare gas (typically argon) atmosphere, an oxygen atmosphere, or an atmosphere including a rare gas (typically argon) and oxygen. In the case of using a sputtering method, it is preferable that film formation be performed with a target including $SiO_2$ at 2 wt % to 10 wt % inclusive so that $SiO_x$ (X>0) which inhibits crystallization is included in the oxide semiconductor film so that the oxide semiconductor film may be prevented from being crystallized in heat treatment performed later for dehydration or dehydrogenation.

Here, the oxide semiconductor film is formed in an atmosphere of argon and oxygen (argon:oxygen=30 sccm:20 sccm and the oxygen flow rate is 40%), with use of an oxide semiconductor target including In, Ga, and Zn ($In_2O_3$:$Ga_2O_3$:ZnO=1:1:1 [mol %] and In:Ga:Zn=1:1:0.5 [at %]), under conditions as follows: the distance between the substrate and the target is 100 mm; the pressure is 0.2 Pa; and the direct current (DC) power supply is 0.5 kW. Note that a pulse direct current (DC) power supply is preferable because dust can be reduced and the film thickness can be uniform. The In—Ga—Zn—O-based non-single-crystal film is formed with a thickness of 5 nm to 200 nm. In this embodiment, as the oxide semiconductor film, a 20-nm-thick In—Ga—Zn—O-based non-single-crystal film is formed by a sputtering method with use of an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film can be formed by electric discharge of plural kinds of material at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering in which voltage is also applied to a substrate during deposition.

Then, by a third photolithography step, the oxide semiconductor film 130 is processed into an island-shaped oxide semiconductor layer. Note that in order to obtain the oxide semiconductor layer overlapping with the source electrode layer 115*a* and the drain electrode layer 115*b*, materials and conditions of etching are adjusted as appropriate so that the source electrode layer 115*a* and the drain electrode layer 115*b* are not removed when the oxide semiconductor layer is etched. Note that a resist mask for forming the island-shaped oxide semiconductor layer may be formed by an ink jetting method. Formation of the resist mask by an ink jetting method needs no photomask; thus, manufacturing cost can be reduced.

Next, the oxide semiconductor layer is subjected to dehydration or dehydrogenation. First heat treatment for dehydration or dehydrogenation is performed at a temperature of 400° C. or higher and lower than a strain point of the substrate, preferably, 425° C. or higher and lower than the strain point of the substrate. Note that in the case of the temperature that is 425° C. or higher, the heat treatment time may be one hour or shorter, whereas in the case of the temperature lower than 425° C., the heat treatment time is longer than one hour. Here, the substrate is introduced into an electric furnace which is one of heat treatment apparatuses, and heat treatment is performed on the oxide semiconductor layer in a nitrogen atmosphere. After that, the oxide semiconductor layer is prevented from being exposed to air and from again including water or hydrogen; thus the oxide semiconductor layer 113 is obtained (see FIG. 2C). In this embodiment, one furnace used in the heat treatment is continuously used up to the time when the temperature is lowered from the heat temperature T at which dehydration or dehydrogenation of the oxide semiconductor layer 113 is performed to the temperature which is enough to prevent reincorporation of water. Specifically, slow cooling is performed in a nitrogen atmosphere up to the time when the temperature becomes lower than the heat temperature T by 100° C. or more. Without being limited to a nitrogen atmosphere, dehydration or dehydrogenation is performed in a rare gas atmosphere, such as helium, neon, or argon.

Note that in the first heat treatment, it is preferable that moisture, hydrogen, or the like be not contained in nitrogen or a rare gas such as helium, neon, or argon. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

Further, depending on the conditions of the first heat treatment or a material of the oxide semiconductor layer, the oxide semiconductor layer is crystallized to be a microcrystalline film or a polycrystalline film in some cases.

In addition, the first heat treatment of the oxide semiconductor layer can also be performed on the oxide semiconductor film 130 before being processed into the island-shaped oxide semiconductor layer. In that case, the substrate is taken out from a heating apparatus after the first heat treatment; then, a photolithography step is performed.

Before the oxide semiconductor film 130 is formed, the second gate insulating layer 102*b* may be subjected to heat treatment (at 400° C. or higher and lower than the strain point of the substrate) in an inert gas atmosphere (e.g., nitrogen, helium, neon, or argon) or an oxygen atmosphere to remove impurities such as hydrogen or water included in the second gate insulating layer 102*b*.

Then, an oxide insulating film is formed over the second gate insulating layer 102*b*, the source electrode layer 115*a*, the drain electrode layer 115*b*, and the oxide semiconductor layer 113 by a sputtering method. Then, a resist mask is formed by a fourth photolithography step, and the oxide insulating layers 107*a* and 107*b* are formed by selective etching. After that, the resist mask is removed. At this stage, the oxide semiconductor layer 113 has regions in contact with the oxide insulating layer 107. A region of this regions which overlaps with the gate electrode layer 111 with the gate insulating layer 102 interposed therebetween and overlaps with the oxide insulating layer 107*a* is a channel formation region. In addition, the oxide semiconductor layer 113 has regions overlapping with the oxide insulating layer 107*b* which covers the opposite ends of the oxide semiconductor layer 113 in the channel length direction. The thickness of a part of the oxide semiconductor layer 113 may be reduced when the oxide insulating film is selectively etched.

The oxide insulating film can be formed with a thickness of at least 1 nm by a method with which impurities such as water or hydrogen are not mixed into the oxide insulating film, such as a sputtering method, as appropriate. In this embodiment, a 300-nm-thick silicon oxide film is formed by a sputtering method, as the oxide insulating film. The substrate temperature in film formation may be room temperature to 300° C. inclusive. In this embodiment, the substrate temperature is room temperature. The formation of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with use of a silicon target, a silicon oxide film can be formed by a sputtering method in an atmosphere of oxygen and nitrogen. As the oxide insulating film which is formed in contact with the oxide semiconductor layer, an inorganic insulating film which does not include impurities such as moisture, a hydrogen ion, or OH⁻ and blocks entry of these from the outside is used. Specifically, a silicon oxide film, a silicon nitride oxide film, an aluminum oxide film, or an aluminum oxynitride film is used.

Figure 2D:
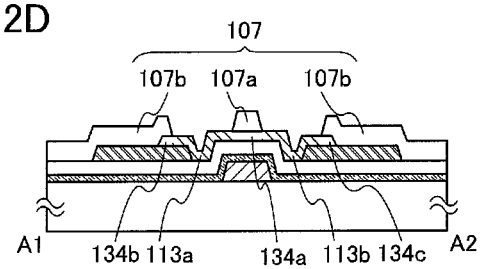

Then, second heat treatment is performed in an inert gas atmosphere or a nitrogen atmosphere (preferably at a 200° C. to 400° C. inclusive, e.g., 250° C. to 350° C. inclusive) (see FIG. 2D). For example, the second heat treatment is performed at 250° C. for one hour in a nitrogen atmosphere. In the second heat treatment, the oxide semiconductor layer 113 is heated in such a condition that the oxide semiconductor layer 113 is partly in contact with the oxide insulating layer. The contact portions in the oxide semiconductor layer 113 are opposite ends in the channel length direction which overlap with the oxide insulating layers 107b and a part which overlaps with the oxide insulating layer 107a. Note that in the second heat treatment, a portion of the oxide semiconductor layer 113 which does not overlap with the oxide insulating layers 107a and 107b is heated while being exposed. When heat treatment is performed in a nitrogen atmosphere or an inert gas atmosphere where oxide semiconductor layer 113 is exposed, resistance can be reduced in the high-resistance (I-type) region in the oxide semiconductor layer 113 which is exposed. The oxide insulating layer 107a is provided over and in contact with the channel formation region in the oxide semiconductor layer 113 and serves as a channel protective layer.

As illustrated in FIG. 2D, oxygen is supplied from the oxide insulating layer 107 to make part of the oxide semiconductor layer 113 into the oxygen-excess state, whereby the channel formation region 134a is selectively formed in a region of the oxide semiconductor layer 113 which is in contact with the oxide insulating layer 107a. Similarly, the first region 134b and the second region 134c are each formed in a region which is in contact with the oxide insulating layer 107b. In addition, the high-resistance source region 113a and the high-resistance drain region 113b are formed in a self-aligned manner in exposed regions of the oxide semiconductor layer 113 in this step.

In such a manner, the width of the channel formation region 134a in the channel length direction can be determined depending on the patterning of the oxide insulating layer 107a; therefore, the channel length can be easily shortened. A short channel length will lead to high-speed operation of the thin film transistor 150 and low power consumption. In particular, a short channel length is more preferable in the case where the thin film transistor 150 is included in a driver circuit which is required to operate at high speed.

Figure 2E:
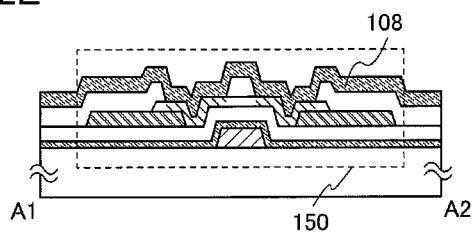

Then, the protective insulating layer 108 is formed over the oxide insulating layers 107a and 107b, the high-resistance source region 113a, and the high-resistance drain region 113b (see FIG. 2E). In this embodiment, a silicon nitride film is formed by an RF sputtering method. An RF sputtering method has superiority in mass production and thus is a preferable method for forming the protective insulating layer 108. The protective insulating layer 108 does not contain impurities such as moisture, a hydrogen ion, or OH⁻ and is formed using an inorganic insulating film which prevents the impurities from entering from the outside. Specifically, a silicon nitride film, an aluminum nitride film, a silicon nitride oxide film, an aluminum oxynitride film, or the like is used.

By the above steps, the thin film transistor 150 which includes the gate electrode layer 111 over the substrate 100 with an insulating surface, the gate insulating layer 102 over the gate electrode layer 111, the source electrode layer 115a and the drain electrode layer 115b over the gate insulating layer 102, the oxide semiconductor layer 113 over the gate insulating layer 102 and the gate electrode layer 111, the oxide insulating layer 107 over the oxide semiconductor layer 113, and the protective insulating layer 108 over the oxide insulating layer 107 and the oxide semiconductor layer 113 can be formed.

By the above steps, in the bottom-gate thin film transistor, the source electrode layer and the drain electrode layer are formed in such a manner that they do not overlap with the gate electrode layer, whereby the distance between the gate electrode layer and the source electrode layer and between the gate electrode layer and the drain electrode layer are increased. In addition, a channel formation region with a short channel length is provided. Thus, a semiconductor device with sufficiently reduced parasitic capacitance and a short channel length which is capable of high-speed operation can be provided.

Note that the structure described in this embodiment can be combined with any of the structures described in the other embodiments as appropriate.

Embodiment 3

In this embodiment, a description will be provided of an example in which an active matrix liquid crystal display device is manufactured by using the thin film transistor described in Embodiment 1 to form a pixel portion and a driver circuit over one substrate.

Figure 3:
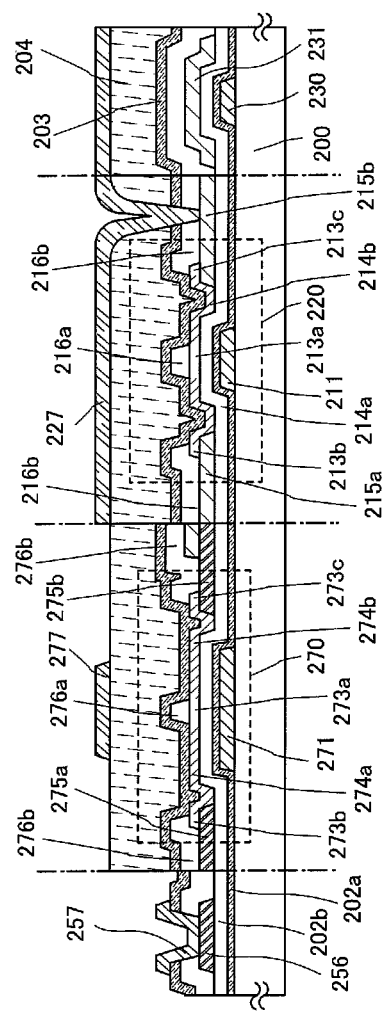
FIG. 3 is a cross-sectional view according to one embodiment of the present invention.

FIG. 3 illustrates an example of a cross-sectional structure of the active matrix substrate.

In this embodiment, a thin film transistor in a pixel portion, a thin film transistor in a driver circuit, a storage capacitor, a gate wiring, a terminal portion of source wiring are described with reference to FIG. 3. The capacitor, the gate wiring, and the terminal portion of the source wiring can be formed in the same manufacturing steps as in Embodiment 2, up to the step of the formation of a protective insulating layer 203 and can be manufactured without an increase in the number of photomasks and an increase in the number of steps. Further, in a portion serving as a display region in the pixel portion, all the gate wiring, the source wiring, and a capacitor wiring layer are formed using light-transmitting conductive films, which results in high aperture ratio.

In FIG. 3, a thin film transistor 220 electrically connected to a pixel electrode layer 227 is a bottom-contact thin film transistor and is provided in the pixel portion. In this embodiment, the thin film transistor having the same structure as the thin film transistor 150 of Embodiment 1 is used. The thin film transistor 220 includes, over a substrate 200 having an insulating surface, a gate electrode layer 211; the first gate insulating layer 202a; the second gate insulating layer 202b; an oxide semiconductor layer having at least a channel formation region 213a, a high-resistance source region 214a, and a high-resistance drain region 214b; the source electrode layer 215a; and the drain electrode layer 215b. Further, the oxide insulating layer 216a in contact with the channel formation region 213a is also provided. Note that the gate electrode layer 211, the source electrode layer 215a, and the drain electrode layer 215b are formed using light-transmitting conductive films.

Here, the source electrode layer 215a and the drain electrode layer 215b are formed in such a manner that they do not overlap with the gate electrode layer 211, whereby the distance between the gate electrode layer 211 and the source electrode layer 215a and between the gate electrode layer 211 and the drain electrode layer 215b are increased. Thus, parasitic capacitance and leakage current can be suppressed.

A first region 213b and a second region 213c in the oxide semiconductor layer which overlap with the oxide insulating layer 216b are in the oxygen-excess state like the channel formation region 213a, and reduce leakage current and parasitic capacitance.

The protective insulating layer 203 is provided to cover the thin film transistor in the pixel portion, the thin film transistor in the driver circuit, and the storage capacitor. For the protective insulating layer 203, an inorganic insulating film such as a silicon nitride film, an aluminum nitride film, a silicon nitride oxide film, or an aluminum oxynitride film is used. In this embodiment, a silicon nitride film is used.

A planarization insulating layer 204 is formed over the protective insulating layer 203. The planarization insulating layer 204 can be formed of a heat-resistant organic material, such as polyimide, acrylic, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. The planarization insulating layer 204 may be formed by stacking a plurality of insulating films formed of these materials. In the embodiment, a photosensitive resin material is used for the planarization insulating layer 204, and the step of forming a resist mask is omitted.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method of forming the insulating layer 204. Depending on the material, the insulating layer 204 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like.

The pixel electrode layer 227 is provided over the planarization insulating layer 204 to overlap with the thin film transistor in the pixel portion and the storage capacitor. The pixel electrode layer 227 is formed using a light-transmitting conductive film. The light-transmitting conductive film is formed of indium oxide ($In_2O_3$), an indium oxide-tin oxide alloy ($In_2O_3$—$SnO_2$, abbreviated as ITO), or the like by a sputtering method, a vacuum evaporation method, or the like. Alternatively, an Al—Zn—O-based non-single-crystal film including nitrogen, that is, an Al—Zn—O—N-based non-single-crystal film, a Zn—O—N-based non-single-crystal film including nitrogen, or a Sn—Zn—O—N-based non-single-crystal film including nitrogen may be used. Note that the percentage (atomic %) of zinc in the Al—Zn—O—N-based non-single-crystal film is 47 atomic % or lower and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated particularly in etching of ITO, an indium oxide-zinc oxide alloy ($In_2O_3$—ZnO) may be used to improve etching processability.

Note that the unit of the proportion of components in the light-transmitting conductive film is atomic percent, and the percentage of components is evaluated by analysis using an electron probe X-ray microanalyzer (EPMA).

Note that a contact hole for connection of the pixel electrode layer 227 and the drain electrode layer 215b is formed in the following manner: a hole in the planarization insulating layer 204 formed of a photosensitive resin is formed by photolithography, and then parts of the protective insulating layer 203 and the oxide insulating layer 216b which are exposed in the hole are etched. In the case where a resist mask is formed over the planarization insulating layer 204, the planarization insulating layer 204 is also etched. In this step, the resist mask may be formed by an ink jetting method. Formation of the resist mask by an ink jetting method needs no photomask; thus, manufacturing cost can be reduced. Alternatively, a part of the oxide insulating layer 216b which will be the contact hole may be etched away in the formation of the oxide insulating layers 216a and 216b.

Further, after the light-transmitting conductive film is formed, a photolithography step is performed to form a resist mask and an unnecessary portion is removed by etching, whereby the pixel electrode layer 227 is formed. Note that the process from the formation of the thin film transistor described in Embodiment 2 up to the formation of the pixel electrode layer can be performed using six photomasks in total.

A capacitor wiring layer 230, which is formed using the same light-transmitting conductive material and step as the gate electrode layer 211 of the thin film transistor 220, overlaps with a capacitor electrode 231 with the first gate insulating layer 202a and the second gate insulating layer 202b serving as a dielectric interposed therebetween, thereby forming the storage capacitor. Note that the capacitor electrode 231 is formed using the same light-transmitting material and formation step as the source electrode layer 215a and drain electrode layer 215b of the thin film transistor 220. Thus, the storage capacitor has a light-transmitting property as well as the thin film transistor 220, so that the aperture ratio can be improved.

It is important for the storage capacitor to have a light-transmitting property in improving the aperture ratio. In a small liquid crystal display panel of 10 inches or smaller in particular, a high aperture ratio can be realized even when the size of a pixel is made small in order to realize higher resolution of display images by increasing the number of gate wirings, for example. Further, a high aperture ratio can be realized by using light-transmitting films as materials of the thin film transistor 220 and the storage capacitor even when one pixel is divided into a plurality of subpixels in order to realize a wide viewing angle. That is, a high aperture ratio can be realized even when a group of thin film transistors are densely arranged, and the display region can have a sufficient area. For example, when one pixel includes two to four subpixels and storage capacitors, the storage capacitors have light-transmitting properties as well as the thin film transistors, so that the aperture ratio can be improved.

Note that the storage capacitor is provided below the pixel electrode layer 227, and the capacitor electrode 231 is electrically connected to the pixel electrode layer 227.

In FIG. 3, an example is described in which the storage capacitor is formed using the capacitor electrode 231 and the capacitor wiring layer 230; however, there is no particular limitation on the structure of the storage capacitor. For example, the storage capacitor may be formed in such a manner that, without provision of a capacitor wiring layer, a pixel electrode layer overlaps with a gate wiring in an adjacent pixel with a planarization insulating layer, a protective insulating layer, and a gate insulating layer therebetween.

Figure 6A:
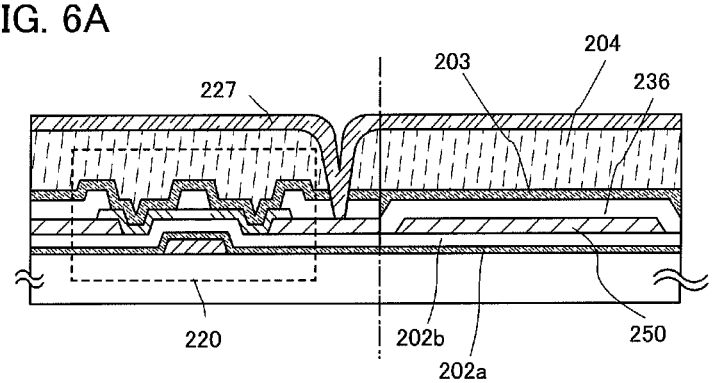
FIGS. 6A and 6B are cross-sectional views according to one embodiment of the present invention.
Figure 6B:
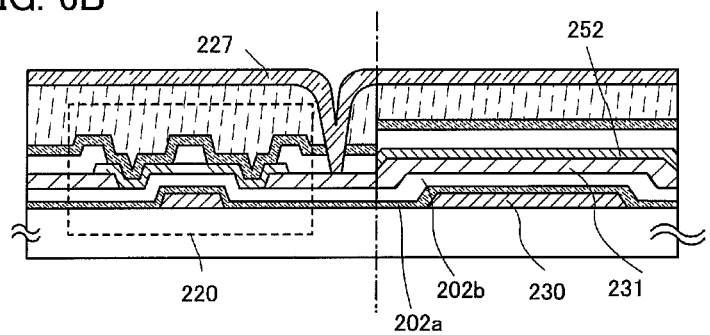

Alternatively, a storage capacitor having a structure illustrated in FIG. 6A or FIG. 6B may be employed, for example. FIG. 6A is the same as FIG. 3 except that there is a difference in the structure of the storage capacitor. Therefore, the same components are denoted by the same reference numerals and detailed description of the same components is omitted. FIG. 6A illustrates a cross-sectional structure of the thin film transistor 220 in the pixel portion and a storage capacitor.

FIG. 6A illustrates an example in which a storage capacitor is formed by the pixel electrode layer 227 and a capacitor wiring layer 250 which overlaps with the pixel electrode layer 227 with the use of an oxide insulating layer 236, the protective insulating layer 203, and the planarizing insulating layer 204 as a dielectric. The capacitor wiring layer 250 is formed using the same light-transmitting material and in the same step as the source electrode layer of the thin film transistor 220 in the pixel portion; therefore, the capacitor wiring layer 250 is disposed so as not to overlap with the source wiring layer of the thin film transistor 220.

In the storage capacitor illustrated in FIG. 6A, the pair of electrodes and the dielectric have a light-transmitting property, and thus the whole storage capacitor has a light-transmitting property.

FIG. 6B illustrates an example of a storage capacitor having a structure different from that in FIG. 6A. FIG. 6B is also the same as FIG. 3 except that there is a difference in the structure of the storage capacitor. Therefore, the same components are denoted by the same reference numerals and detailed description of the same components is omitted.

FIG. 6B illustrates an example in which a storage capacitor is formed by the capacitor wiring layer 230 and a stack of an oxide semiconductor layer 252 and the capacitor electrode 231 which overlaps with the capacitor wiring layer 230, using the first gate insulating layer 202a and the second gate insulating layer 202b as a dielectric. Further, the oxide semiconductor layer 252 is stacked over and in contact with the capacitor electrode 231 and serves as one of electrodes of the storage capacitor. Note that the oxide semiconductor layer 252 is formed using the same light-transmitting material and in the same step as the oxide semiconductor layer of the thin film transistor 220. Note that the capacitor electrode 231 is formed using the same light-transmitting material and in the same step as the source electrode layer or the drain electrode layer of the thin film transistor 220. The capacitor wiring layer 230 is formed using the same light-transmitting material and in the same step as the gate electrode layer of the thin film transistor 220; therefore, the capacitor wiring layer 230 is disposed so as not to overlap with a gate wiring layer of the thin film transistor 220.

In addition, the capacitor electrode 231 is electrically connected to the pixel electrode layer 227.

Also in the storage capacitor illustrated in FIG. 6B, the pair of electrodes and the dielectric have a light-transmitting property, and thus the whole storage capacitor has a light-transmitting property.

The storage capacitors illustrated in FIGS. 6A and 6B have a light-transmitting property, and high definition of displayed images is achieved by increasing the number of gate wirings, for example. Therefore, even when the pixel size is reduced, sufficient capacitance and a high aperture ratio can be obtained.

A thin film transistor 270 is a bottom-contact thin film transistor and is provided in the driver circuit. The thin film transistor 270 has a shorter channel length L than the thin film transistor 220 so that higher operation speed is realized. The channel length L of the bottom-contact thin film transistor in the driver circuit is preferably set to 0.1 µm to 2 µm inclusive.

The thin film transistor 270 includes, over a substrate 200 having an insulating surface, a gate electrode layer 271; the first gate insulating layer 202a; the second gate insulating layer 202b, an oxide semiconductor layer having at least a channel formation region 273a, a high-resistance source region 274a, and a high-resistance drain region 274b; the source electrode layer 275a; and the drain electrode layer 275b. Further, the oxide insulating layer 276a in contact with the channel formation region 273a is also provided. The width of the channel formation region 273a in the channel length direction can be determined by patterning of the oxide insulating layer 276a, whereby the channel length can be easily made short. A short channel length will lead to high-speed operation of the thin film transistor 270 and low power consumption. A short channel length is particularly preferable in the thin film transistor 270 which is formed in a driver circuit required to operate at high speed.

Here, the source electrode layer 275a and the drain electrode layer 275b are formed in such a manner that they do not overlap with the gate electrode layer 271, whereby the distance between the gate electrode layer 271 and the source electrode layer 275a and between the gate electrode layer 271 and the drain electrode layer 275b are increased. Thus, parasitic capacitance and leakage current can be suppressed.

A first region 273b and a second region 273c in the oxide semiconductor layer which overlap with the oxide insulating layer 276b are in the oxygen-excess state like the channel formation region 273a, and reduce leakage current and parasitic capacitance.

The width of the gate electrode layer 271 in the channel length direction in the thin film transistor 270 is larger than the width of the gate electrode layer 211 in the channel length direction in the thin film transistor 220. With such a structure, a larger amount of current can be applied to the gate electrode layer 271 than to the gate electrode layer 211 of the thin film transistor 220 in the pixel portion.

When a liquid crystal display panel has a size of more than 10 inches, such as 60 inches or 120 inches, there is a possibility that wiring resistance of a wiring having a light-transmitting property becomes a problem; therefore, a metal wiring is preferably used as a part of the wirings so that the wiring resistance is reduced. For example, the source electrode layer 275a and the drain electrode layer 275b are formed using metal conductive films of Ti or the like. Since a metal wiring is formed, the number of photomasks is increased by one as compared to the case of Embodiment 1.

It is also possible that a metal conductive film of, e.g., titanium is used as the source electrode layer 275a and the drain electrode layer 275b so that oxygen is extracted from the high-resistance source region 274a and the high-resistance drain region 274b to form a region with higher carrier concentration than the high-resistance source region 274a and the high-resistance drain region 274b at the interfaces between the source electrode layer 275a and the high-resistance source region 274a and between the drain electrode layer 275b and the high-resistance drain region 274b.

The thin film transistor 270 in the driver circuit may be a four-terminal transistor including a conductive layer 277 above the oxide semiconductor layer. The gate electrode layer 271 of the thin film transistor 270 in the driver circuit may be electrically connected to a conductive layer 277 provided above the oxide semiconductor layer. In that case, a contact hole is formed by selectively etching the planarization insulating layer 204, the protective insulating layer 203, the oxide insulating layer 276b, the first gate insulating layer 202a, and the second gate insulating layer 202b, like the contact hole for electrically connecting the drain electrode layer 215b of the thin film transistor 220 and the pixel electrode layer 227. Through this contact hole, the conductive layer 277 is electrically connected to the gate electrode layer 271 of the thin film transistor 270 in the driver circuit.

Plural gate wirings, source wirings, and capacitor wiring layers are provided in accordance with the pixel density. In the terminal portion, plural first terminal electrodes at the same potential as the gate wiring, plural second terminal electrodes at the same potential as the source wiring, plural third terminal electrodes at the same potential as the capacitor wiring layer, and the like are arranged. The number of each of the terminal electrodes may be any number determined as appropriate by the practitioner.

In the embodiment, a photosensitive resin material is used for the planarization insulating layer 204, and the step of forming a resist mask is omitted. Thus, without use of a resist mask, a structure in which there is no planarization insulating layer 204 in the terminal portion can be formed.

In the terminal portion, the first terminal electrode at the same potential as the gate wiring can be formed using the same light-transmitting material as the pixel electrode layer 227. The first terminal electrode is electrically connected to the gate wiring through a contact hole reaching the gate wiring. The contact hole reaching the gate wiring is formed by selectively etching the protective insulating layer 203, the oxide insulating layer 276b, and the first gate insulating layer 202a, and the second gate insulating layer 202b, like the contact hole for electrically connecting the drain electrode layer 215b of the thin film transistor 220 and the pixel electrode layer 227.

A second terminal electrode 257 at the same potential as the source wiring 256 in the terminal portion can be formed using the same light-transmitting material as the pixel electrode layer 227. The second terminal electrode 257 is electrically connected to the source wiring 256 through a contact hole reaching the source wiring 256. The source wiring is a metal wiring formed using the same material and step as the source electrode layer 275a of the thin film transistor 270, and is at the same potential as the source electrode layer 275a.

The third terminal electrode at the same potential as the capacitor wiring layer 230 can be formed using the same light-transmitting material as the pixel electrode layer 227. A contact hole reaching the capacitor wiring layer 230 can be formed by using the same photomask and step as a contact hole for electrically connecting the capacitor electrode 231 and the pixel electrode layer 227.

When an active matrix liquid crystal display device is manufactured, an active matrix substrate and a counter substrate provided with a counter electrode are fixed with a liquid crystal layer therebetween. Note that a common electrode electrically connected to the counter electrode provided for the counter substrate is provided over the active matrix substrate, and a fourth terminal electrode electrically connected to the common electrode is provided in the terminal portion. This fourth terminal electrode is a terminal for setting the common electrode at a fixed potential such as GND or 0 V. The fourth terminal electrode can be formed using the same light-transmitting material as the pixel electrode layer 227.

Since a thin film transistor is easily broken due to static electricity or the like, a protective circuit is preferably provided over the same substrate as the pixel portion or the driver circuit. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits are provided so as to prevent breakage of the a pixel transistor and the like which can be caused when a surge voltage due to static electricity or the like is applied to a scan line, a signal line, and a capacitor bus line. The protective circuit is formed so as to release charge to a common wiring and the like when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed in the same step as the thin film transistor 220 in the pixel portion, and can be made to have the same properties as a diode by connecting a gate terminal to a drain terminal of the non-linear element.

Note that the structure described in this embodiment can be combined with any of the structures described in the other embodiments as appropriate.

Embodiment 4

In this embodiment, an example of a structure of a terminal portion provided over the same substrate as the thin film transistor will be described. Although an example of the terminal portion of the source wiring is described in Embodiment 3, a terminal portion of the source wiring which is different from the terminal portion described in Embodiment 3 and a terminal portion of the gate wiring are shown in this embodiment. Note that in FIGS. 4A1 to 4B2, components common to FIG. 3 maintain the same reference numerals.

FIGS. 4A1 and 4A2 are a cross-sectional view and a top view of the terminal portion of the gate wiring, respectively. FIG. 4A1 is the cross-sectional view taken along line C1-C2 of FIG. 4A2. In FIG. 4A1, a transparent conductive layer 225 formed over a protective insulating layer 203 is a terminal electrode for connection which serves as an input terminal. Furthermore, in the terminal portion of FIG. 4A1, a first terminal 221 formed of the same material as the gate wiring and a connection electrode layer 223 formed of the same material as the source wiring overlap with each other with the first gate insulating layer 202a and the second gate insulating layer 202b interposed therebetween, and are electrically connected to each other via the transparent conductive layer 225. Furthermore, when the structure illustrated in FIG. 3 is employed, the first terminal 221 can be formed of a metal wiring material.

FIGS. 4B1 and 4B2 are respectively a cross-sectional view and a top view of the terminal portion of the source wiring which is different from the source wiring terminal portion illustrated in FIG. 3. FIG. 4B1 is the cross-sectional view taken along line C3-C4 of FIG. 4B2. In FIG. 4B1, the transparent conductive layer 225 formed over the oxide insulating layer 266 is the terminal electrode for connection which serves as an input terminal. Furthermore, in the terminal portion of FIG. 4B1, an electrode layer 226 formed of the same material as the gate wiring is located below and overlaps with a second terminal 222, which is electrically connected to the source wiring, with the first gate insulating layer 202a and the second gate insulating layer 202b interposed therebetween. The electrode layer 226 is not electrically connected to the second terminal 222. When the potential of the electrode layer 226 is set to a potential which is different from that of the second terminal 222, such as floating, GND, or 0 V, a capacitor for preventing noise or static electricity can be formed. In addition, the second terminal 222 is electrically connected to the transparent conductive layer 225 through a contact hole formed in the protective insulating layer 203 and the oxide insulating layer 266. Furthermore, when the structure illustrated in FIG. 3 is employed, the second terminal 222 can be formed of a metal wiring material.

Plural gate wirings, source wirings, and capacitor wirings are provided in accordance with the pixel density. In the terminal portion, plural first terminals at the same potential as the gate wiring, plural second terminals at the same potential as the source wiring, plural third terminals at the same potential as the capacitor wiring, and the like are arranged. The number of each of the terminal electrodes may be any number determined as appropriate by the practitioner.

Note that the structure described in this embodiment can be combined with any of the structures described in the other embodiments as appropriate.

Embodiment 5

In this embodiment, a description will be provided of an example of a liquid crystal display device in which a liquid crystal layer is sealed between a first substrate and a second substrate, and a common connection portion electrically connected to the counter electrode provided for the second substrate is formed over the first substrate. Note that a thin film transistor is formed as a switching element over the first substrate, and the common connection portion is manufactured in the same process as the switching element in the pixel portion, thereby being obtained without complicating the process.

The common connection portion is provided in a position that overlaps with a sealant for bonding the first substrate and the second substrate, and is electrically connected to the counter electrode via conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the counter electrode.

Figure 5A:
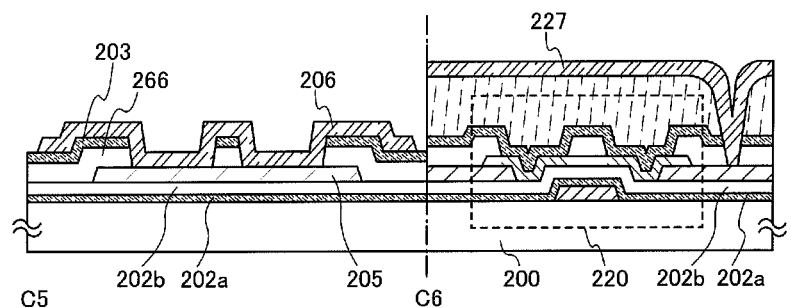
FIGS. 5A and 5B are a plan view and a cross-sectional view according to one embodiment of the present invention.

FIG. 5A is a cross-sectional view of a semiconductor device in which a thin film transistor and a common connection portion are formed over one substrate.

In FIG. 5A, the thin film transistor 220 electrically connected to the pixel electrode layer 227 is a bottom-contact thin film transistor and is provided in the pixel portion. In this embodiment, the thin film transistor has the same structure as the thin film transistor 150 of Embodiment 1.

Figure 5B:
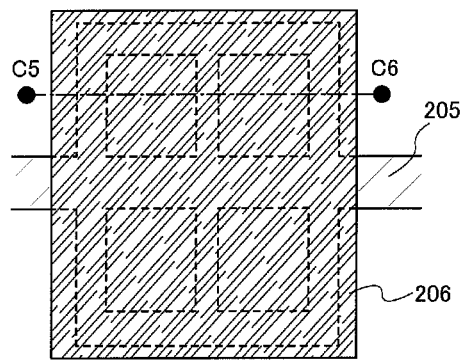

FIG. 5B illustrates an example of a top view of the common connection portion, and dashed line C5-C6 in FIG. 5B corresponds to a cross section of the common connection portion of FIG. 5A. Note that in FIG. 5B, components common to FIG. 5A maintain the same reference numerals.

A common potential line 205 is provided over the gate insulating layer 202b, and formed by using the same material and step as the source electrode layer and the drain electrode layer of the thin film transistor 220.

Also, the common potential line 205 is covered with the oxide insulating layer 266 and the protective insulating layer 203. The protective insulating layer 203 and the oxide insulating layer 266 have a plurality of openings overlapping with the common potential line 205. This opening is formed by using the same step as the contact hole that connects the drain electrode layer of the thin film transistor 220 to the pixel electrode layer 227.

Note that because of a significant difference in area, a distinction is made here between the contact hole in the pixel portion and the opening in the common connection portion. Further, in FIG. 5A, the pixel portion and the common connection portion are not illustrated on the same scale. For example, the length of the dashed line C5-C6 in the common connection portion is about 500 μm while the width of the thin film transistor is less than 50 μm; thus, the common connection portion actually has greater than or equal to ten times as large area as the thin film transistor. However, for simplicity, the pixel portion and the common connection portion are shown on different scales in FIG. 5A.

A common electrode layer 206 is provided over the common potential line 205, the protective insulating layer 203, the oxide insulating layer 266, and formed by using the same material and step as the pixel electrode layer 227 in the pixel portion.

In this manner, the common connection portion is manufactured in the same step as the switching element in the pixel portion.

The first substrate provided with the pixel portion and the common connection portion and the second substrate having the counter electrode are fixed with the sealant.

When the sealant is made to contain conductive particles, the pair of substrates are aligned so that the sealant overlaps with the common connection portion. For example, in a small liquid crystal panel, two common connection portions are arranged so as to overlap with the sealant at opposite corners of the pixel portion and the like. In a large liquid crystal panel, four or more common connection portions are arranged so as to overlap with the sealant.

Note that the common electrode layer 206 is an electrode in contact with the conductive particles contained in the sealant, and is electrically connected to the counter electrode of the second substrate.

When a liquid crystal injection method is used, the pair of substrates are fixed with the sealant, and then liquid crystal is injected between the pair of substrates. Alternatively, when a liquid crystal dropping method is used, the sealant is drawn on the second substrate or the first substrate, liquid crystal is dropped thereon, and then the pair of substrates are bonded to each other under a reduced pressure.

An example of the common connection portion electrically connected to the counter electrode is described in this embodiment, but without any limitation thereto, such a common connection portion can be used as a connection portion connected to any other wiring or an external connection terminal or the like.

Note that the structure described in this embodiment can be combined with any of the structures described in the other embodiments as appropriate.

Embodiment 6

In this embodiment, an example will be described below in which at least some of driver circuits and a thin film transistor placed in a pixel portion are formed over one substrate.

The thin film transistor placed in the pixel portion is formed as described in any of Embodiments 1 to 5. Since the thin film transistor described in any of Embodiments 1 to 5 is an n-channel TFT, some of driver circuits that can be constituted by n-channel TFTs among the driver circuits are formed over the substrate where the thin film transistor in the pixel portion is formed.

Figure 12A:
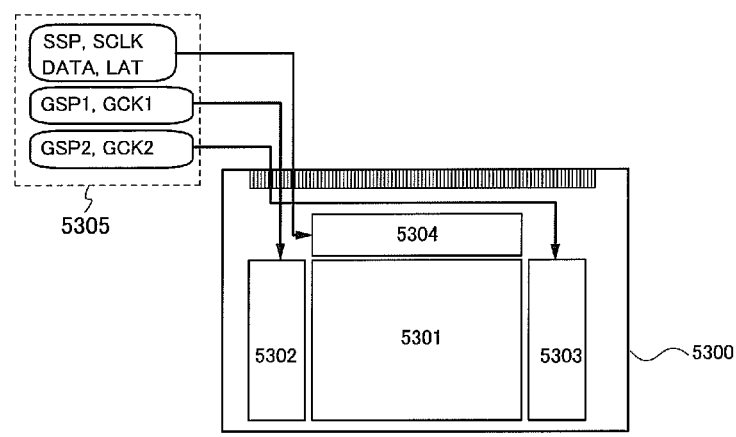
FIGS. 12A and 12B are block diagrams of semiconductor devices.

FIG. 12A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that in cross regions of the scan lines and the signal lines, pixels each having a display element are arranged in a matrix. The substrate 5300 of the display device is connected to a timing control circuit 5305 (also referred to as a controller or a control IC) via a connection portion such as a flexible printed circuit (FPC).

In FIG. 12A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connections in the connection portion which are formed when wirings are extended from a driver circuit provided outside the substrate 5300 can be reduced, and the reliability or yield can be increased.

Note that the timing control circuit 5305 supplies, for example, a first scan line driver circuit start signal (GSP1) and a scan line driver circuit clock signal (GCLK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCLK2) to the second scan line driver circuit 5303. Moreover, the timing control circuit 5305 supplies a signal line driver circuit start signal (SSP), a signal line driver circuit clock signal (SCLK), video signal data (DATA, also simply referred to as a video signal), and a latch signal (LAT) to the signal line driver circuit 5304. Each clock signal may be a plurality of clock signals with shifted phases or may be supplied together with a signal (CLKB) obtained by inverting the clock signal. Note that it is possible to omit one of the first scan line driver circuit 5302 and the second scan line driver circuit 5303.

Figure 12B:
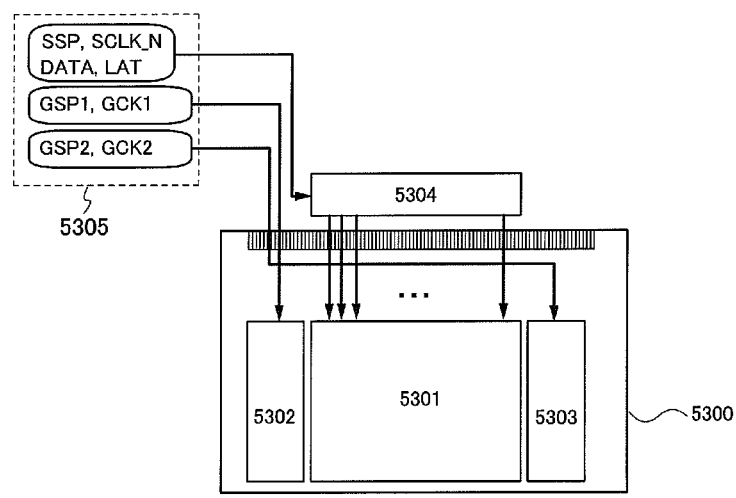

FIG. 12B illustrates a structure in which circuits with lower driving frequency (e.g., the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, an increase in size of the display device, a reduction in cost, an improvement in yield, or the like can be achieved.

Figure 13A:
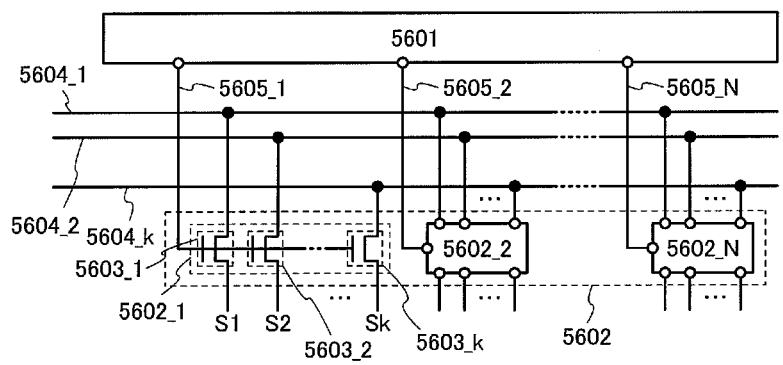
FIG. 13A illustrates a structure of a signal line driver circuit and FIG. 13B is a timing diagram of the signal line driver circuit.
Figure 13B:
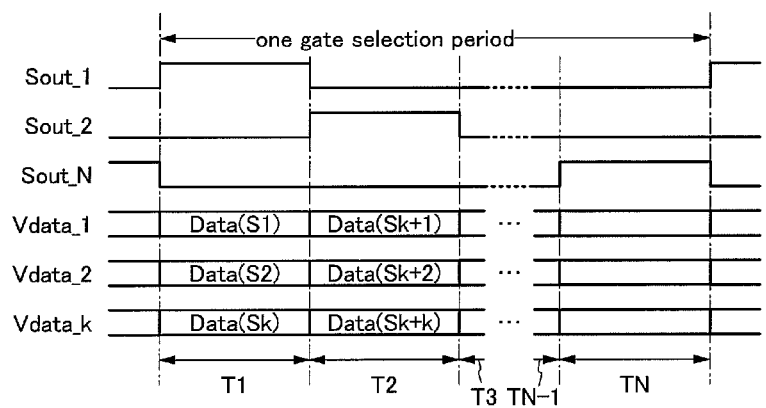

The thin film transistors in any of Embodiments 1 to 5 are n-channel TFTs. FIGS. 13A and 13B illustrate an example of a structure and operation of a signal line driver circuit constituted by n-channel TFTs.

The signal line driver circuit includes a shift register 5601 and a switching circuit 5602. The switching circuit 5602 includes a plurality of switching circuits 5602_1 to 5602_N(N is a natural number). The switching circuits 5602_1 to 5602_N each include a plurality of thin film transistors 5603_1 to 5603_k (k is a natural number). The example where the thin film transistors 5603_1 to 5603_k are n-channel TFTs is described below.

A connection relation in the signal line driver circuit is described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling electrical continuity between the wirings 5604_1 to 5604_k and the signal lines S1 to Sk (electrical continuity between the first terminals and the second terminals), that is, a function of controlling whether potentials of the wirings 5604_1 to 5604_k are supplied to the signal lines S1 to Sk. In this manner, the switching circuit 5602_1 serves as a selector. Moreover, the thin film transistors 5603_1 to 5603_k have functions of controlling conduction states between the wirings 5604_1 to 5604_k and the signal lines S1 to Sk, respectively, that is, functions of supplying potentials of the wirings 5604_1 to 5604_k to the signal lines S1 to Sk, respectively. In this manner, each of the thin film transistors 5603_1 to 5603k serves as a switch.

The video signal data (DATA) is input to each of the wirings 5604_1 to 5604_k. The video signal data (DATA) is often an analog signal that corresponds to an image signal or image data.

Next, the operation of the signal line driver circuit in FIG. 13A is described with reference to a timing diagram in FIG. 13B. FIG. 13B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in the selected row through the thin film transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signal data (DATA) is written into pixels by a plurality of columns; thus, insufficient writing of video signal data (DATA) can be prevented.

Note that any of the circuits constituted by the thin film transistors in any of Embodiments 1 to 5 can be used for the shift register 5601 and the switching circuit 5602. In that case, the shift register 5601 can be constituted by only n-channel transistors or only p-channel transistors.

One embodiment of a shift register which is used for a part of the scan line driver circuit and/or the signal line driver circuit is described with reference to FIGS. 14A to 14D and FIGS. 15A and 15B.

The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply a large current is used.

Figure 14A:
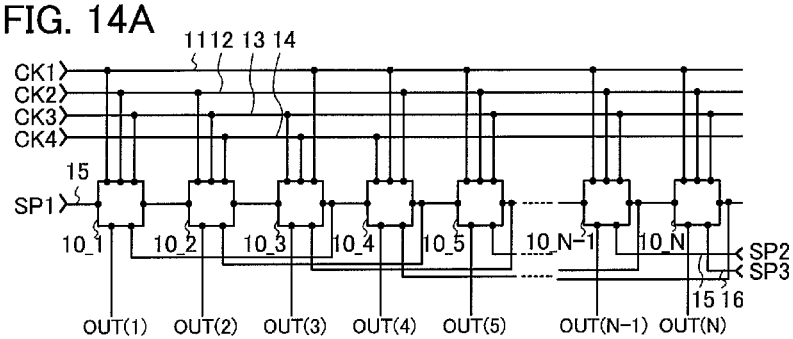
FIGS. 14A to 14D are circuit diagrams of a shift register.

The shift register includes a first to Nth pulse output circuits 10_1 to 10_N (N is a natural number greater than or equal to 3) (see FIG. 14A). In the shift register illustrated in FIG. 14A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1) where n is a natural number greater than or equal to 2 and less than or equal to N) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another circuit or the like. Note that since the subsequent-stage signal OUT(n+2) is not input to the last two stages of the shift register as illustrated in FIG. 14A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially. In this embodiment, driving or the like of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 14A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 14B:
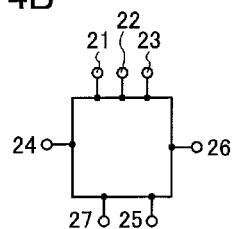

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 14B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1) (SR) is output from the first output terminal 26; and the second output signal OUT(1) is output from the second output terminal 27.

Figure 14C:
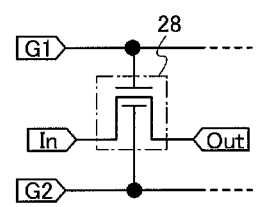

In the first to Nth pulse output circuits 10_1 to 10_N, the thin film transistor (TFT) having four terminals described in the above embodiment can be used in addition to a thin film transistor having three terminals. FIG. 14C illustrates the symbol of a thin film transistor 28 having four terminals, which is described in the above embodiment. The symbol of the thin film transistor 28 illustrated in FIG. 14C represents the thin film transistor having four terminals which is described in Embodiment 1 and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control electric current between an IN terminal and an OUT terminal with a first control signal G1 which is input to a lower gate electrode and a second control signal G2 which is input to an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the thin film transistor 28 illustrated in FIG. 14C can be controlled to be a desired level by providing gate electrodes above and below a channel formation region of the thin film transistor 28 with a gate insulating film interposed between the upper gate electrode and the channel formation region and between the lower gate electrode and the channel formation region, and by controlling a potential of the upper gate electrode and/or the lower gate electrode.

Next, an example of a specific circuit configuration of the pulse output circuit illustrated in FIG. 14B will be described with reference to FIG. 14D.

Figure 14D:
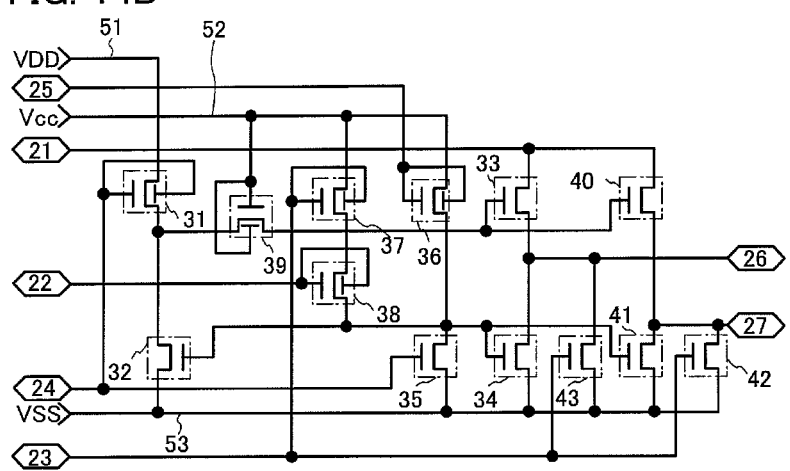

The pulse output circuit illustrated in FIG. 14D includes a first to thirteenth transistors 31 to 43. A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 14D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the second power supply potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that as in FIG. 14D, the thin film transistor 28 with four terminals which is illustrated in FIG. 14C is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor 28 with four terminals which is illustrated in FIG. 14C, the threshold voltage can be controlled, and a malfunction of the pulse output circuit can be further reduced. Note that although the first control signal G1 and the second control signal G2 are the same control signals in FIG. 14D, the first control signal G1 and the second control signal G2 may be different control signals.

In FIG. 14D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 14D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 15A:
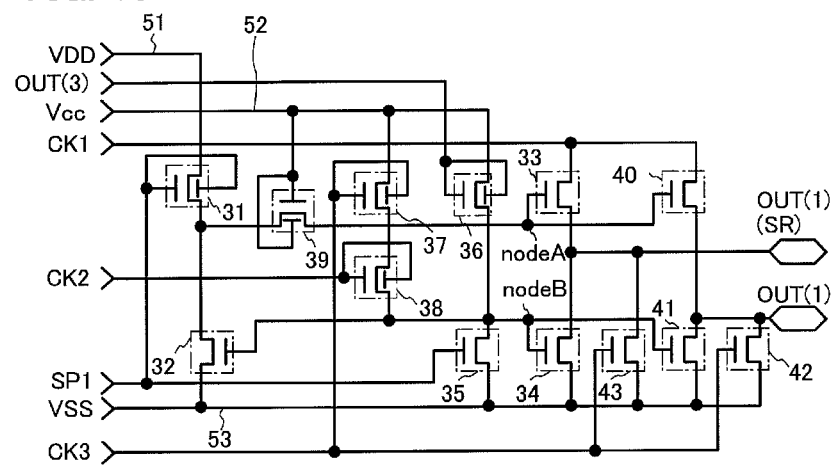
FIG. 15A illustrates a structure of a shift register and FIG. 15B is a timing diagram of the shift register.

FIG. 15A illustrates signals that are input to or output from the first to fifth input terminals 21 to 25 and the first and second output terminals 26 and 27 in the case where the pulse output circuit illustrated in FIG. 14D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3)

is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 14D and FIG. 15A, a capacitor for performing bootstrap operation by bringing the node A into a floating state may be additionally provided. Furthermore, a capacitor having one electrode electrically connected to the node B may be additionally provided in order to hold a potential of the node B.

Figure 15B:
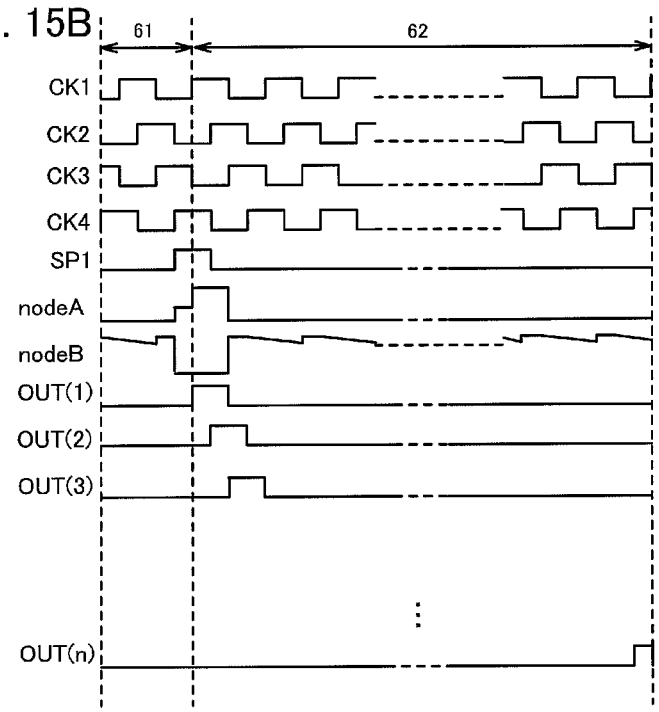

FIG. 15B is a timing diagram of a shift register including a plurality of pulse output circuits illustrated in FIG. 15A. Note that when the shift register is included in a scan line driver circuit, a period 61 in FIG. 15B corresponds to a vertical retrace period and a period 62 corresponds to a gate selection period.

Note that by providing the ninth transistor 39 in which the second power supply potential VCC is applied to the gate as illustrated in FIG. 15A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, a high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, an increase in potential of the second terminal of the first transistor 31 can be prevented while the potential of the node A is raised by bootstrap operation. In other words, providing the ninth transistor 39 can lower the level of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 can be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode compared to a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 may be supplied from the second input terminal 22 and the third input terminal 23, respectively. In the shift register illustrated in FIG. 15A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the case where a state of the seventh transistor 37 and the eighth transistor 38 in the shift register illustrated in FIG. 15A is changed so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by fall in potentials of the second input terminal 22 and the third input terminal 23, is caused only once by fall in potential of the gate electrode of the eighth transistor 38. Consequently, the connection relation, in which the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38, is preferable. This because the number of times of the change in the potential of the node B can be reduced, whereby the noise can be decreased.

In such a manner, an H-level signal is regularly supplied to the node B in a period during which the potentials of the first output terminal 26 and the second output terminal 27 are held at an L level; thus, a malfunction of the pulse output circuit can be suppressed.

Note that the structure described in this embodiment can be combined with any of the structures described in the other embodiments as appropriate.

Embodiment 7

By manufacturing thin film transistors and using the thin film transistors for a pixel portion and driver circuit, a semiconductor device having a display function (also referred to as a display device) can be manufactured. Moreover, some or all of the driver circuits which include the thin film transistors, can be formed over a substrate where the pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes an element whose luminance is controlled by current or voltage in its category, and specifically includes an inorganic electroluminescent (EL) element, an organic EL element, and the like in its category. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 8A1, 8A2, and 8B. FIGS. 8A1 and 8A2 are plan views of panels in which thin film transistors 4010 and 4011 and a liquid crystal element 4013 are sealed between a first substrate 4001 and a second substrate 4006 with a sealant 4005. FIG. 8B is a cross-sectional view along M-N in FIGS. 8A1 and 8A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 8A1 illustrates an example in which the signal line driver circuit 4003 is mounted by a COG method. FIG. 8A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 8B illustrates the thin film transistor 4010 included in the pixel portion 4002 and the thin film transistor 4011 included in the scan line driver circuit 4004, as an example. Insulating layers 4041a, 4041b, 4042a, 4042b, 4020, and 4021 are provided over the thin film transistors 4010 and 4011.

Any of the highly reliable thin film transistors including the oxide semiconductor layers which are described in Embodiments 1 to 5 can be used as the thin film transistors 4010 and 4011. The thin film transistor 270 and the thin film transistor 220 described in Embodiment 3 are preferably used as the thin film transistor 4011 for the driver circuit and as the thin film transistor 4010 for a pixel, respectively. In this embodiment, the thin film transistors 4010 and 4011 are n-channel thin film transistors.

A conductive layer 4040 is provided over a part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. The plastic can be a fiberglass-reinforced plastics (FRP) plate, a polyvinyl fluoride (PVF) film, a polyester film, or an acrylic resin film.

A spacer 4035 is a columnar spacer which is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other via conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is generated within a relatively narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

Although, a polarizing plate is provided on the outer surface of the substrate (on the viewer side) and a coloring layer (a color filter) and an electrode layer used for a display element are sequentially provided on the inner surface of the substrate in the example of the liquid crystal display device, the polarizing plate may be provided on the inner surface of the substrate. The stacked-layer structure of the polarizing plate and the coloring layer is not limited to that in this embodiment and may be set as appropriate depending on materials of the polarizing plate and the coloring layer or conditions of the manufacturing process. Further, a lightblocking film serving as a black matrix may be provided in a portion other than the display portion.

In the thin film transistor 4011, the insulating layer 4041*a* which serves as a channel protective layer and the insulating layer 4041*b* which covers a peripheral part (and side surfaces) of the oxide semiconductor layer having a stacked-layer structure are formed. In a similar manner, in the thin film transistor 4010, the insulating layer 4042*a* which serves as a channel protective layer and the insulating layer 4042*b* which covers a peripheral part (and side surfaces) of the oxide semiconductor layer having a stacked-layer structure are formed.

The insulating layers 4041*b* and 4042*b* which cover the peripheral part (and the side surfaces) of the oxide semiconductor layer having a stacked-layer structure increases the distance between the gate electrode layer and a wiring layer (e.g., a source wiring layer or a capacitor wiring layer) over or in the vicinity of the gate electrode layer, whereby parasitic capacitance can be reduced. The insulating layers 4041*a*, 4041*b*, 4042*a*, and 4042*b* may be formed using a material and a method which are similar to those of the oxide insulating layers 107*a* and 107*b* described in any of Embodiments 1 to 5. In addition, in order to reduce the surface roughness due to the thin film transistors, the thin film transistors are covered with the insulating layer 4021 serving as a planarization insulating film. Here, as the insulating layers 4041*a*, 4041*b*, 4042*a*, and 4042*b*, a silicon oxide film is formed by a sputtering method according to Embodiment 2.

The insulating layer 4020 is formed over the insulating layers 4041*a*, 4101*b*, 4042*a*, and 4042*b*. The insulating layer 4020 can be formed using a material and a method which are similar to those of the protective insulating layer 203 described in Embodiment 3. Here, a silicon nitride film is formed by an RF sputtering method or a PCVD method as the insulating layer 4020.

The insulating layer 4021 is formed as the planarization insulating film. The insulating layer 4021 can be formed using a material and a method which are similar to those of the planarization insulating layer 204 described in Embodiment 3, and a heat-resistant organic material such as polyimide, an acrylic resin, benzocyclobutene-based resin, polyamide, or epoxy resin can be used. As an alternative to such organic materials, it is possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed of these materials.

In this embodiment, a plurality of thin film transistors in the pixel portion may be surrounded together by a nitride insulating film. For example, a structure may be employed in which a nitride insulating film is used as the insulating layer 4020 and the gate insulating layer, and the insulating layer 4020 is in contact with the gate insulating layer at least in the periphery surrounding the pixel portion over the active matrix substrate. By employing the above structure, entry of moisture from the outside can be prevented. Moreover, entry of moisture from the outside can be prevented in the long term even after the device is completed as a semiconductor device, for example, as a display device; thus, the long-term reliability of the device can be improved.

Note that the siloxane-based resin corresponds to a resin including a Si—O—Si bond formed using a siloxane-based material as a starting material. The siloxane-based resin may include an organic group (e.g., an alkyl group or an aryl group) as a substituent. The organic group may include a fluoro group.

There is no particular limitation on the method of forming the insulating layer 4021. Depending on the material, the insulating layer 4021 can be formed by a method such as sputtering method, an SOG method, a spin coating method, a dipping method, a spray coating method, or a droplet discharge method (e.g., an ink jetting method, screen printing, or offset printing), or by using a tool (apparatus) such as a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called if-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as a source and drain electrode layers of the thin film transistor 4010.

The connection terminal electrode 4015 is electrically connected to a terminal included in the FPC 4018 via an anisotropic conductive film 4019.

Note that FIGS. 8A1, 8A2, and 8B illustrate the example in which the signal line driver circuit 4003 is formed separately and mounted on the first substrate 4001; however, this embodiment is not limited to this structure. The scan line driver circuit may be separately formed and then mounted, or only a part of the signal line driver circuit or a part of the scan line driver circuit may be separately formed and then mounted.

Figure 17:
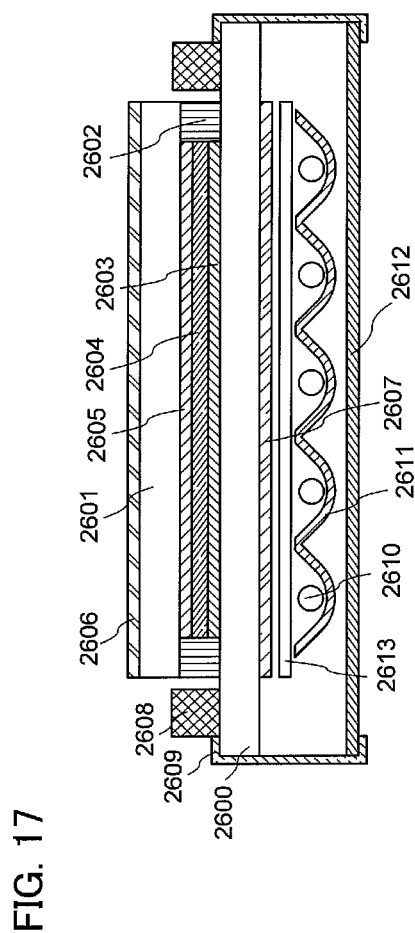
FIG. 17 illustrates a semiconductor device.

FIG. 17 illustrates an example of a liquid crystal display module which is formed as a semiconductor device using a TFT substrate 2600 manufactured according to the manufacturing method disclosed in this specification.

FIG. 17 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above steps, a highly reliable liquid crystal display panel as a semiconductor device can be manufactured.

Note that the structure described in this embodiment can be combined with any of the structures described in the other embodiments as appropriate.

Embodiment 8)

An example of an electronic paper will be described as an example of a semiconductor device.

The semiconductor device can be used for an electronic paper in which electronic ink is driven by an element electrically connected to a switching element. The electronic paper is also called an electrophoretic display device (an electrophoretic display) and has advantages in that it has the same level of readability as plain paper, it has less power consumption than other display devices, and it can be made thin and lightweight.

There are a variety of modes of electrophoretic displays. The electrophoretic display includes a plurality of microcapsules dispersed in a solvent or a solute; each microcapsule containing first particles which are positively charged and second particles which are negatively charged. When electric field is applied to the microcapsules, the particles in the microcapsules move in opposite directions to each other and only the color of the particles gathered on one side is displayed. Note that the first particles or the second particles include a pigment, and do not move without an electric field. The first particles and the second particles have different colors (which may be colorless).

Thus, the electrophoretic display utilizes a so-called dielectrophoretic effect, in which a substance with high dielectric constant moves to a region with a high electric field.

A solution in which the above microcapsules are dispersed in a solvent is referred to as electronic ink. Electronic ink can be printed on a surface of glass, plastic, fabric, paper, or the like. Furthermore, by use of a color filter or particles that have a pigment, color display can also be achieved.

In addition, if a plurality of the above microcapsules are arranged as appropriate over an active matrix substrate so as to be interposed between two electrodes, an active matrix display device can be completed. Images can be displayed by application of an electric field to the microcapsules. For example, the active matrix substrate obtained using the thin film transistors described in Embodiment 1 to 5 can be used.

Note that the first particles and the second particles in the microcapsules may be formed from any one of a conductive material, an insulating material, a semiconductor material, a magnetic material, a liquid crystal material, a ferroelectric material, an electroluminescent material, an electrochromic material, and a magnetophoretic material, or formed from a composite material thereof.

Figure 16:
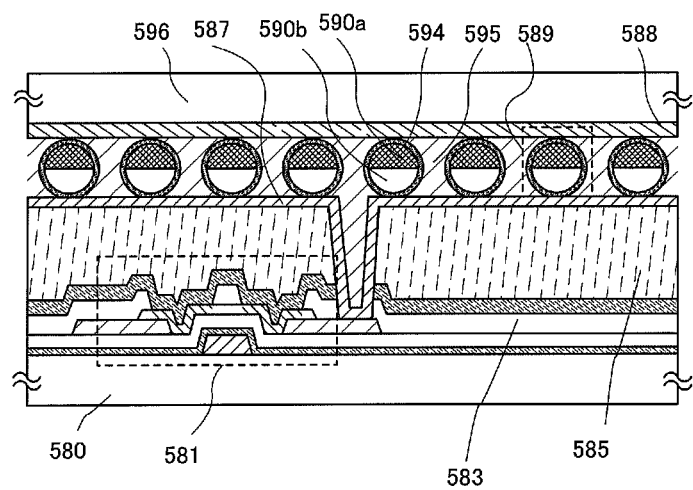
FIG. 16 illustrates a semiconductor device.

FIG. 16 illustrates an active matrix electronic paper as an example of a semiconductor device. A thin film transistor 581 used for the semiconductor device can be manufactured in a manner similar to that of the thin film transistor described in any of Embodiments 1 to 5 and is a highly reliable thin film transistor including an oxide semiconductor layer. The thin film transistor described in any of Embodiments 1 to 5 can also be used as the thin film transistor 581 in this embodiment.

The electronic paper of FIG. 16 is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and is covered with an insulating film 583 which is in contact with the oxide semiconductor layer. A source or drain electrode layer of the thin film transistor 581 is in contact with a first electrode layer 587 through an opening formed in an insulating layer 585 and the like, whereby the thin film transistor 581 is electrically connected to the first electrode layer 587. Between the first electrode layer 587 and a second electrode layer 588 formed on a substrate 596, spherical particles 589 each having a black region 590*a*, a white region 590*b*, and a cavity 594 around the regions which is filled with liquid are provided (see FIG. 16). Space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between the pair of substrates.

Instead of the element using the twisting ball, an electrophoretic element can be used. A microcapsule having a diameter of about 10 mm to 200 mm in which transparent liquid, positively-charged white microparticles, and negatively-charged black microparticles are encapsulated, is used. In the microcapsules which are provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim environment. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is disconnected from a power supply.

Through the above steps, a highly reliable electronic paper as a semiconductor device can be manufactured.

Note that the structure described in this embodiment can be combined with any of the structures described in the other embodiments as appropriate.

Embodiment 9

An example of a light-emitting display device will be described as a semiconductor device. As a display element of the display device, a light-emitting element utilizing electroluminescence is described here. Light-emitting elements utilizing electroluminescence are classified according to whether a light emitting material is an organic compound or an inorganic compound. In general, the former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and current flows. Then, those carriers (i.e., electrons and holes) are recombined, and thus, the light-emitting organic compound is excited. When the light-emitting organic compound relaxes to the ground state from the excited state, light is emitted. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 10:
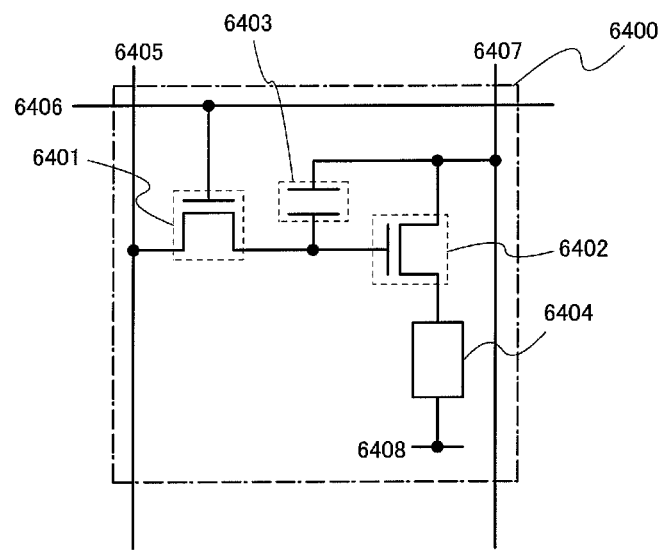
FIG. 10 illustrates a pixel equivalent circuit of a semiconductor device.

FIG. 10 illustrates an example of a pixel structure as an example of a semiconductor device which can be driven by a digital time grayscale method.

The structure and operation of a pixel which can be driven by a digital time grayscale method will be described. In this example, one pixel includes two n-channel transistors using an oxide semiconductor layer in a channel formation region.

A pixel 6400 includes a switching transistor 6401, a driving transistor 6402 for a light-emitting element, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402 for the light-emitting element. The gate of the driving transistor 6402 for the light-emitting element is connected to a power supply line 6407 via the capacitor 6403, a first electrode of the driving transistor 6402 for the light-emitting is connected to the power supply line 6407, and a second electrode of the driving transistor 6402 for the light-emitting element is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. Note that the low power supply potential is a potential lower than a high power supply potential which is supplied to the power supply line 6407. For example, GND or 0 V may be set as the low power supply potential. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 for the light-emitting element is used as a substitute for the capacitor 6403, the capacitor 6403 can be omitted. The gate capacitance of the driving transistor 6402 for the light-emitting element may be formed between a channel region and a gate electrode.

Here, in the case of employing a voltage-input voltage driving method, a video signal is input to the gate of the driving transistor 6402 for the light-emitting element to make the driving transistor 6402 for the light-emitting element completely turn on or off. That is, the driving transistor 6402 for the light-emitting element operates in a linear region, and thus, a voltage higher than the voltage of the power supply line 6407 is applied to the gate of the driving transistor 6402 for the light-emitting element. Note that a voltage greater than or equal to (power supply line voltage+$V_{th}$ of the driving transistor 6402 for the light-emitting element) is applied to the signal line 6405.

In the case of employing an analog grayscale method instead of the digital time grayscale method, the same pixel structure as in FIG. 10 can be employed by inputting signals in a different way.

In the case of employing the analog grayscale method, a voltage greater than or equal to voltage which is the sum of forward voltage of the light-emitting element 6404 and $V_{th}$ of the driving transistor 6402 for the light-emitting element) is applied to the gate of the driving transistor 6402 for the light-emitting element. The forward voltage of the light-emitting element 6404 refers to a voltage to obtain a desired luminance, and is larger than at least a forward threshold voltage. By inputting a video signal to enable the driving transistor 6402 for the light-emitting element to operate in a saturation region, current can be supplied to the light-emitting element 6404. In order that the transistor 6402 for driving the light-emitting element can operate in the saturation region, the potential of the power supply line 6407 is set higher than a gate potential of the driving transistor 6402 for the light-emitting element. Since the video signal is an analog signal, current in accordance with the video signal flows in the light-emitting element 6404, and analog grayscale can be performed.

Note that the pixel structure is not limited to that illustrated in FIG. 10. For example, the pixel in FIG. 10 can further include a switch, a resistor, a capacitor, a transistor, a logic circuit, or the like.

Next, structures of the light-emitting element will be described with reference to FIGS. 11A to 11C. Here, a cross-sectional structure of a pixel will be described using an example where an n-channel TFT is used as a driving TFT for a light-emitting element as an example. TFTs 7001, 7011, and 7021 which are driving TFTs for light-emitting elements used for semiconductor devices illustrated in FIGS. 11A to 11C can be manufactured in a manner similar to that of the thin film transistor used in the pixel which is described in any of Embodiments 1 to 5. The TFTs 7001, 7011, and 7021 are highly reliable thin film transistors each including an oxide semiconductor layer. Alternatively, the thin film transistor used in the pixel which is described in any of Embodiments 1 to 5 can be employed as the TFTs 7001, 7011, and 7021.

In order to extract light emitted from the light-emitting element, at least one of an anode and a cathode should be transparent. There are following structures of a light-emitting element which is formed over the same substrate as a thin film transistor: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate. The pixel structure can be applied to a light-emitting element having any of these emission structures.

A light-emitting element having a top-emission structure will be described with reference to FIG. 11A.

Figure 11A:
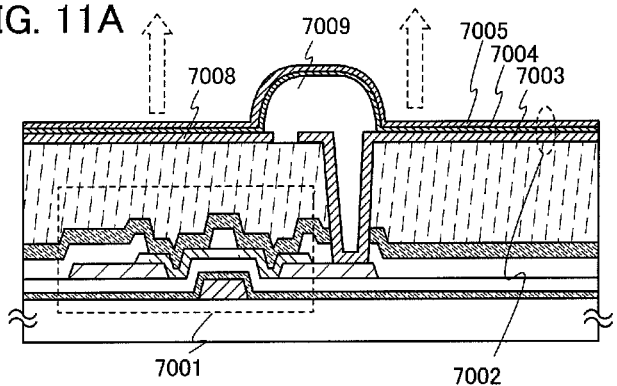
FIGS. 11A to 11C illustrate semiconductor devices.

FIG. 11A is a cross-sectional view of a pixel in the case where the driving TFT 7001 for the light-emitting element is of an n-type and light is emitted from a light-emitting element 7002 through an anode 7005. In FIG. 11A, a cathode 7003 of the light-emitting element 7002 is electrically connected to the driving TFT 7001 for the light-emitting element, and a light-emitting layer 7004 and the anode 7005 are stacked in this order over the cathode 7003. The cathode 7003 can be formed using any of conductive materials which have a low work function and a conductive film of which reflects light. For example, Ca, Al, CaF, MgAg, AlLi, or the like is preferably used. The light-emitting layer 7004 may be formed as a single layer or a stack of plural layers. When the light-emitting layer 7004 is formed as a stack of plural layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided. The anode 7005 is formed of a light-transmitting conductive material. For example, the anode 7005 may be formed using a light-transmitting conductive film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

Further, a partition 7009 is provided between the cathode 7003 and a cathode 7008 of an adjacent pixel, so as to cover end portions thereof. The partition 7009 is formed using an organic resin film such as a film of polyimide, an acrylic resin, polyamide, or an epoxy resin, an inorganic insulating film, or a film of polysiloxane. It is particularly preferable that the partition 7009 be formed using a photosensitive resin material and that a sidewall of the partition 7009 be formed as a tilted surface with a continuous curvature. In the case where a photosensitive resin material is used for the partition 7009, a step of forming a resist mask can be omitted.

The light-emitting element 7002 corresponds to a region where the light-emitting layer 7004 is sandwiched between the cathode 7003 and the anode 7005. In the pixel illustrated in FIG. 11A, light is emitted from the light-emitting element 7002 to the anode 7005 side as indicated by an arrow.

Next, a light-emitting element having a bottom-emission structure will be described with reference to FIG. 11B. FIG. 11B is a cross-sectional view of a pixel in the case where the driving TFT 7011 for the light-emitting element is of an n-type and light is emitted from a light-emitting element 7012 through a cathode 7013. In FIG. 11B, the cathode 7013 of the light-emitting element 7012 is formed over a light-transmitting conductive film 7017 which is electrically connected to the driving TFT 7011 for the light-emitting element, and a light-emitting layer 7014 and an anode 7015 are stacked in this order over the cathode 7013. Note that a blocking film 7016 for reflecting or blocking light may be formed so as to cover the anode 7015 when the anode 7015 has a light-transmitting property. For the cathode 7013, any of conductive materials which have a low work function can be used as in the case of FIG. 11A. Note that the cathode 7013 is formed with a thickness with which the cathode 7013 transmits light (preferably, about 5 nm to 30 nm). For example, an aluminum film with a thickness of 20 nm can be used as the cathode 7013. Similarly to the case of FIG. 11A, the light-emitting layer 7014 may be formed using either a single layer or a stack of plural layers. The anode 7015 is not required to transmit light, but can be formed of a light-transmitting conductive material as in the case of FIG. 11A. As the blocking film 7016, a metal film which reflects light can be used for example; however, it is not limited to a metal film. For example, a resin to which a black pigment is added can also be used.

Further, a partition 7019 is provided between the conductive film 7017 and a conductive film 7018 of an adjacent pixel, so as to cover end portions thereof. The partition 7019 is formed using an organic resin film such as a film of polyimide, an acrylic resin, polyamide, or an epoxy resin, an inorganic insulating film, or a film of polysiloxane. It is particularly preferable that the partition 7019 be formed using a photosensitive resin material and that a sidewall of the partition 7019 be formed as a tilted surface with a continuous curvature. In the case where a photosensitive resin material is used for the partition 7019, a step of forming a resist mask can be omitted.

The light-emitting element 7012 corresponds to a region where the light-emitting layer 7014 is sandwiched between the cathode 7013 and the anode 7015. In the pixel illustrated in FIG. 11B, light is emitted from the light-emitting element 7012 to the cathode 7013 side as indicated by an arrow.

Next, a light-emitting element having a dual-emission structure will be described with reference to FIG. 11C. In FIG. 11C, the cathode 7023 of the light-emitting element 7022 is formed over a light-transmitting conductive film 7027 which is electrically connected to the driving TFT 7021 for the light-emitting element, and a light-emitting layer 7024 and an anode 7025 are stacked in this order over the cathode 7023. For the cathode 7023, any of conductive materials which have a low work function can be used as in the case of FIG. 11A. Note that the cathode 7023 is formed with a thickness with which the cathode 7023 transmits light. For example, an aluminum film with a thickness of 20 nm can be used as the cathode 7023. Similarly to the case of FIG. 11A, the light-emitting layer 7024 may be formed using either a single layer or a stack of plural layers. The anode 7025 can be formed of a light-transmitting conductive material as in the case of FIG. 11A.

Further, a partition 7029 is provided between the conductive film 7027 and a conductive film 7028 of an adjacent pixel, so as to cover end portions thereof. The partition 7029 is formed using an organic resin film such as a film of polyimide, an acrylic resin, polyamide, or an epoxy resin, an inorganic insulating film, or a film of polysiloxane. It is particularly preferable that the partition 7029 be formed using a photosensitive resin material and that a sidewall of the partition 7029 be formed as a tilted surface with a continuous curvature. In the case where a photosensitive resin material is used for the partition 7029, a step of forming a resist mask can be omitted.

The light-emitting element 7022 corresponds to a region where the anode 7025, the light-emitting layer 7024 and the cathode 7023 overlap with each other. In the pixel illustrated in FIG. 11C, light is emitted from the light-emitting element 7022 to both the anode 7025 side and the cathode 7023 side as indicated by an arrow.

Although an organic EL element is described here as a light-emitting element, an inorganic EL element can alternatively be provided as a light-emitting element.

Although the example in which a thin film transistor (a driving TFT for a light-emitting element) which controls the driving of a light-emitting element is electrically connected to the light-emitting element has been described, a structure may be employed in which a TFT for current control is connected between the driving TFT for the light-emitting element and the light-emitting element.

Figure 11B:
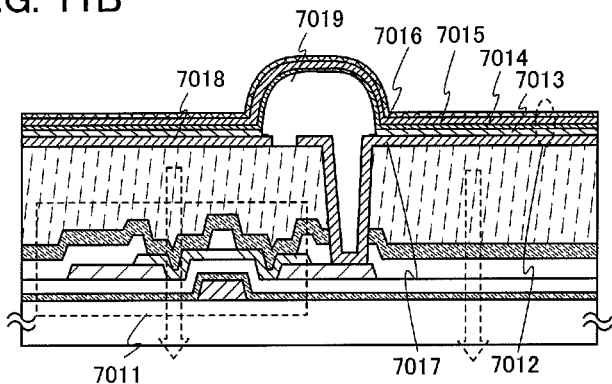
Figure 11C:
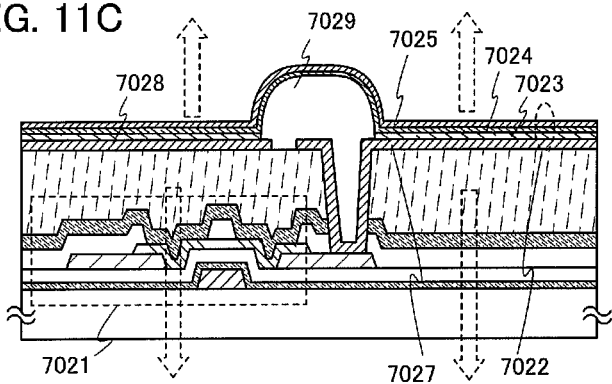

Note that the structure of the semiconductor device is not limited to those illustrated in FIGS. 11A to 11C and can be modified in various ways based on the spirit of techniques according to the present invention.

Figure 9A:
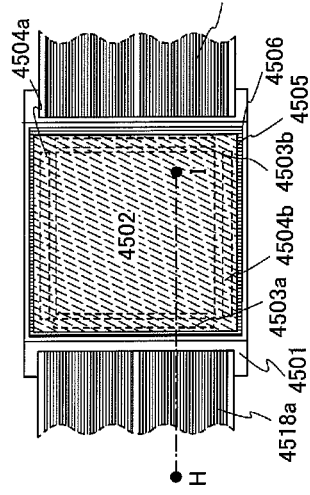
FIGS. 9A and 9B illustrate a semiconductor device.
Figure 9B:
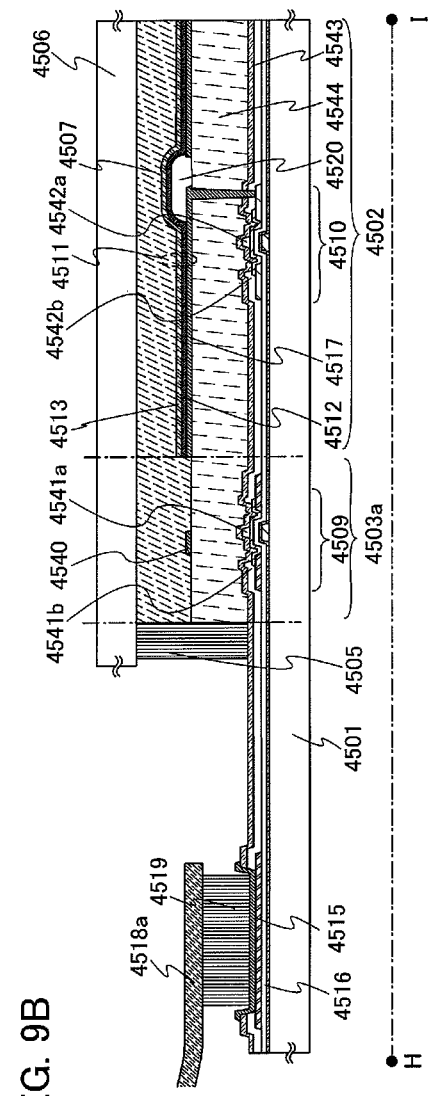

Next, an appearance and a cross section of a light-emitting display panel (also referred to as a light-emitting panel), which is one embodiment of the semiconductor device, will be described with reference to FIGS. 9A and 9B. FIG. 9A is a plan view of a panel in which a thin film transistor and a light-emitting element are sealed between a first substrate and a second substrate with a sealant. FIG. 9B is a cross-sectional view taken along line H-I in FIG. 9A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be thus packaged (sealed) with a protective film (such as a bonding film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b which are formed over the first substrate 4501 each include a plurality of thin film transistors. A thin film transistor 4510 included in the pixel portion 4502 and a thin film transistor 4509 included in the signal line driver circuit 4503a are illustrated as an example in FIG. 9B.

Any of the highly reliable thin film transistors including the oxide semiconductor layers which are described in Embodiments 1 to 5 can be used as the thin film transistors 4509 and 4509. The thin film transistor 270 and the thin film transistor 220 described in Embodiment 3 are preferably used as the thin film transistor 4509 for the driver circuit and as the thin film transistor 4510 for a pixel, respectively. In this embodiment, the thin film transistors 4509 and 4510 are n-channel thin film transistors.

A conductive layer 4540 is provided over a part of the insulating layer 4544, which overlaps with a channel formation region of an oxide semiconductor layer in the thin film transistor 4509 for the driver circuit. The conductive layer 4540 is provided at the position overlapping with the channel formation region of the oxide semiconductor layer, whereby the amount of change in threshold voltage of the thin film transistor 4509 before and after the BT test can be reduced. A potential of the conductive layer 4540 may be the same or different from that of a gate electrode layer of the thin film transistor 4509. The conductive layer 4540 can also function as a second gate electrode layer. Alternatively, the potential of the conductive layer 4540 may be GND or 0 V, or the conductive layer 4540 may be in a floating state.

In the thin film transistor 4509, the insulating layer 4541a which serves as a channel protective layer and the insulating layer 4541b which covers a peripheral part (and side surfaces) of the oxide semiconductor layer having a stacked-layer structure are formed. In a similar manner, in the thin film transistor 4510, the insulating layer 4542a which serves as a channel protective layer and the insulating layer 4542b which covers a peripheral part (and side surfaces) of the oxide semiconductor layer having a stacked-layer structure are formed.

The insulating layers 4541b and 4542b which cover the peripheral part (and the side surface) of the oxide semiconductor layer having a stacked-layer structure increases the distance between the gate electrode layer and a wiring layer (e.g., a source wiring layer or a capacitor wiring layer) over or in the vicinity of the gate electrode layer, whereby parasitic capacitance can be reduced. The insulating layers 4541a, 4541b, 4542a, and 4542b may be formed using a material and a method which are similar to those of the oxide insulating layers 107a and 107b described in any of Embodiments 1 to 5. In addition, in order to reduce the surface roughness due to the thin film transistors, the thin film transistors are covered with the insulating layer 4543 serving as a planarization insulating film. Here, as the insulating layers 4541a, 4541b, 4542a, and 4542b, a silicon oxide film is formed by a sputtering method according to Embodiment 1.

The insulating layer 4543 is formed over the insulating layers 4541a, 4541b, 4542a, and 4542b. The insulating layer 4543 can be formed using a material and a method which are similar to those of the protective insulating layer 108 described in Embodiment 1. Here, a silicon nitride film is formed by an RF sputtering method as the insulating layer 4543.

The insulating layer 4544 is formed as the planarization insulating film. The insulating layer 4544 can be formed using a material and a method which are similar to those of the planarization insulating layer 204 described in Embodiment 3. Here, the insulating layer 4544 is formed using an acrylic resin.

In this embodiment, a plurality of thin film transistors in the pixel portion may be surrounded together by a nitride insulating film. For example, a structure may be employed in which a nitride insulating film is used as the insulating layer 4543 and the gate insulating layer, and the insulating layer 4543 is in contact with the gate insulating layer at least in the periphery surrounding the pixel portion over the active matrix substrate. By employing the above structure, entry of moisture from the outside can be prevented. Moreover, entry of moisture from the outside can be prevented in the long term even after the device is completed as a semiconductor device, for example, as a display device; thus, the long-term reliability of the device can be improved.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a stacked-layer structure including the first electrode layer 4517, an electroluminescent layer 4512, and a second electrode layer 4513 in this embodiment, the structure of the light-emitting element 4511 is not limited. The structure of the light-emitting element 4511 can be changed as appropriate depending on, for example, the direction in which light is extracted from the light-emitting element 4511.

A partition wall 4520 is formed using an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with a continuous curvature.

The electric field light-emitting layer 4512 may be formed using either a single layer or a stack of plural layers.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

A connection terminal electrode 4515 is formed using the same conductive film as the first electrode layer 4517 included in the light-emitting element 4511. A terminal electrode 4516 is formed using the same conductive film as the source and drain electrode layers included in the thin film transistor 4509.

The connection terminal electrode 4515 is electrically connected to a terminal included in the FPC 4518a via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as an inert gas such as nitrogen or argon. For example, poly(vinyl chloride) (PVC), an acrylic resin, polyimide, an epoxy resin, a silicone resin, poly(vinyl butyral) (PVB), or a copolymer of ethylene with vinyl acetate (EVA) can be used. For example, nitrogen may be used as the filler.

If needed, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Further, the polarizing plate or the circularly polarizing plate may be provided with an anti-reflection film. For example, anti-glare treatment by which reflected light can be diffused by projections and depressions of the surface so as to reduce the glare can be performed.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. Alternatively, only the signal line driver circuits or a part thereof, or only the scan line driver circuits or a part thereof may be separately formed and then mounted. This embodiment is not limited to the structure illustrated in FIGS. 9A and 9B.

Through the above steps, a highly reliable light-emitting device (a display panel) can be manufactured as a semiconductor device.

Note that the structure described in this embodiment can be combined with any of the structures described in the other embodiments as appropriate.

Embodiment 10

Figure 18:
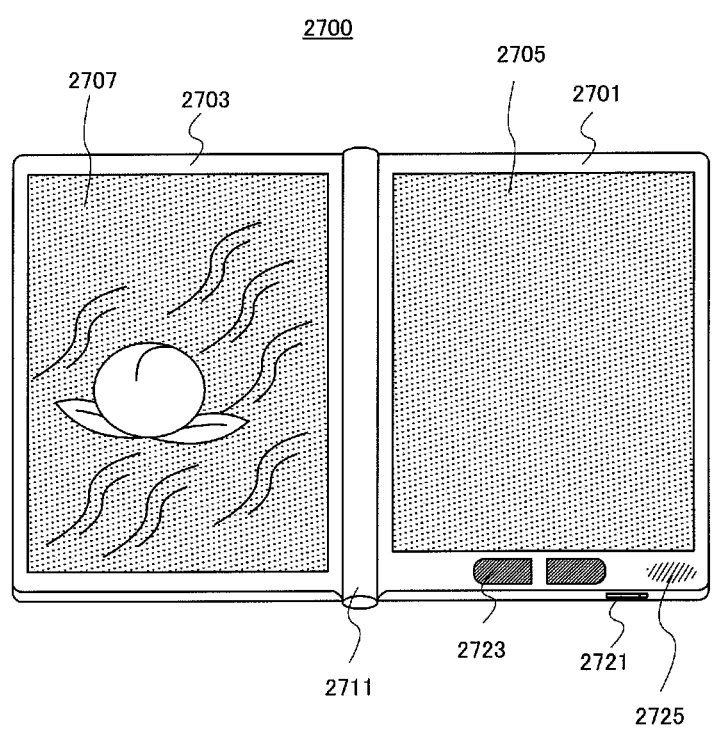
FIG. 18 is an external view of one example of an electronic book reader.

The semiconductor device disclosed in this specification can be applied to an electronic paper. An electronic paper can be used for electronic devices for displaying information in all fields. For example, an electronic paper can be applied to an electronic book reader (an e-book reader), a poster, an advertisement in a vehicle such as a train, or a display of a variety of cards such as a credit card. FIG. 18 illustrates an example of the electronic devices.

FIG. 18 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed along the hinge 2711. With such a structure, the electronic book reader 2700 can be handled like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 18) can display text and a display portion on the left (the display portion 2707 in FIG. 18) can display graphics.

FIG. 18 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter or a USB cable), a storage medium insertion portion, and the like may be provided on the back surface or the side surface of the housing. Moreover, the electronic book reader 2700 may have a function of an electronic dictionary.

The electronic book reader 2700 may be configured to wirelessly transmit and receive data. Through wireless communication, desired book data or the like can be purchased and downloaded from an electronic book server.

Note that the structure described in this embodiment can be combined with any of the structures described in the other embodiments as appropriate.

Embodiment 11

A semiconductor device disclosed in this specification can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio playback device, a large-sized game machine such as a pinball machine, and the like.

Figure 19A:
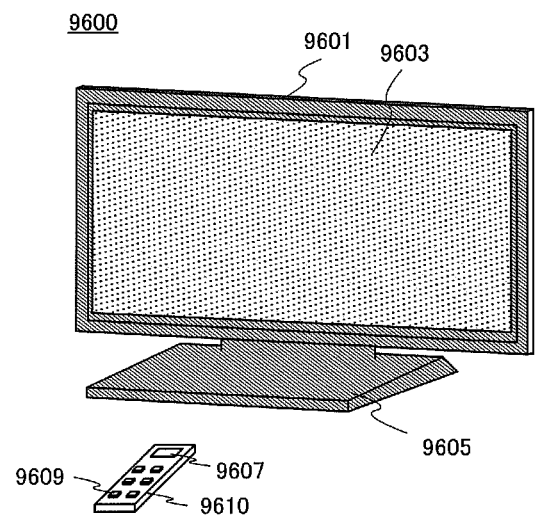
FIGS. 19A and 19B are external views of a television device and a digital photo frame.

FIG. 19A illustrates an example of a television device 9600. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data outputted from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 19B:
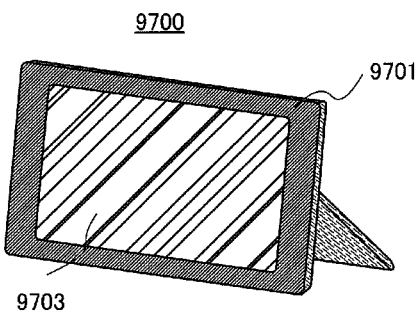

FIG. 19B illustrates an example of a digital photo frame 9700. For example, in the digital photo frame 9700, a display portion 9703 is incorporated in a housing 9701. The display portion 9703 can display a variety of images. For example, the display portion 9703 can display image data taken with a digital camera or the like and function as a normal photo frame.

Note that the digital photo frame 9700 is provided with an operation portion, an external connection terminal (a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, a storage medium storing image data taken with a digital camera is inserted into the storage medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 20A:
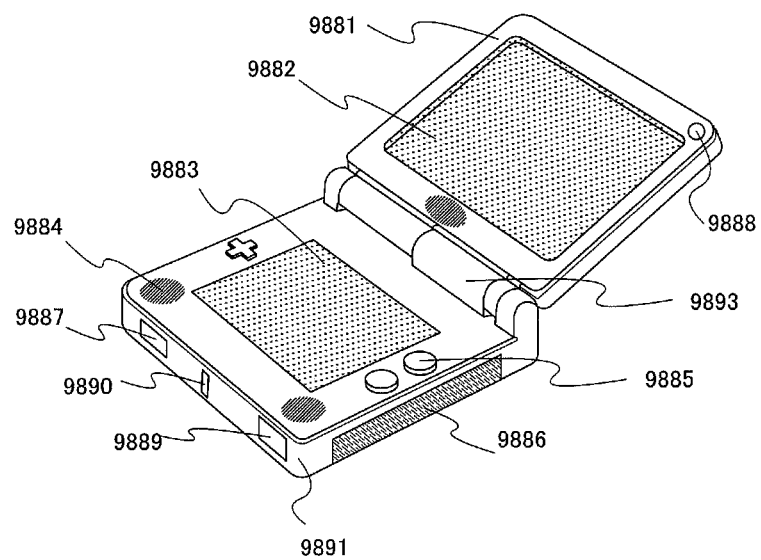
FIGS. 20A and 20B are external views of game machines

FIG. 20A illustrates a portable game console including two housings, a housing 9881 and a housing 9891 which are jointed with a joint portion 9893 so that the portable game console can be opened or folded. A display portion 9882 and a display portion 9883 are incorporated in the housing 9881 and the housing 9891, respectively. In addition, the portable game console illustrated in FIG. 20A is provided with a speaker portion 9884, a storage medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and other structures provided with at least the semiconductor device disclosed in this specification can be employed. The portable game console may include an additional accessory as appropriate. The portable game console illustrated in FIG. 20A has a function of reading a program or data stored in a storage medium to display it on the display portion, and a function of sharing data with another portable game console by wireless communication. Note that a function of the portable game console illustrated in FIG. 20A is not limited to those described above, and the portable game console can have a variety of functions.

Figure 20B:
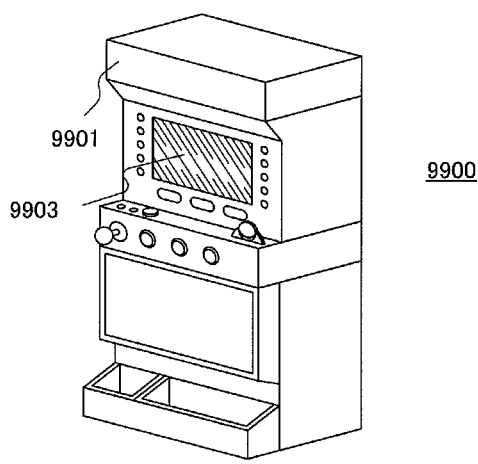

FIG. 20B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 21A:
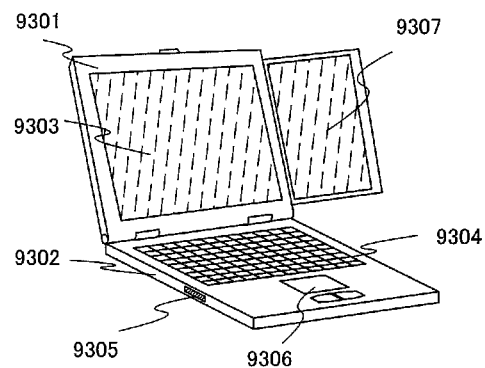
FIGS. 21A and 21B are external views of examples of a portable computer and a mobile phone.

FIG. 21A is a perspective view illustrating an example of a portable computer.

In the portable computer illustrated in FIG. 21A a top housing 9301 having a display portion 9303 and a bottom housing 9302 having a keyboard 9304 can overlap with each other by closing a hinge unit which connects the top housing 9301 and the bottom housing 9302. The portable computer illustrated in FIG. 21A is conveniently carried. In the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch screen, the user can input data by touching a part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 further includes a display portion 9307 which can be stored in the top housing 9301 by being slid therein. With the display portion 9307, a large display screen can be realized. In addition, the user can adjust the angle of a screen of the stowable display portion 9307. If the stowable display portion 9307 is a touch screen, the user can input data by touching a part of the stowable display portion 9307.

The display portion 9303 or the stowable display portion 9307 is formed using an image display device such as a liquid crystal display panel or a light-emitting display panel using an organic light-emitting element, an inorganic light-emitting element, or the like.

In addition, the portable computer illustrated in FIG. 21A can be provided with a receiver and the like and can receive a TV broadcast to display an image on the display portion. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is advantageous for the portable computer whose battery capacity is limited.

Figure 21B:
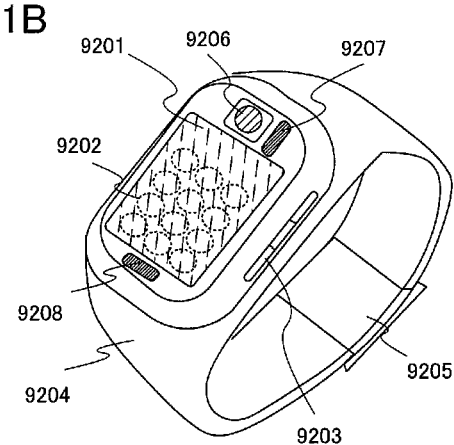

FIG. 21B is a perspective view of an example of a mobile phone that the user can wear on the wrist like a wristwatch.

This mobile phone is formed with a main body which includes a communication device including at least a telephone function, and battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a power switch, a switch for changing display, or a switch for instruction to start taking images. The operation switches 9203 may be a switch for starting a program for the Internet when the switch is pushed. The operation switches 9203 can be configured to have respective functions.

The user can input data into this mobile phone by touching the display portion 9201 with a finger or an input pen, controlling the operation switches 9203, or inputting voice into the microphone 9208. In FIG. 21B, display buttons 9202 are displayed on the display portion 9201. The user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 21B is provided with a receiver of a TV broadcast and the like, and can display an image on the display portion 9201 by receiving the TV broadcast. In addition, the mobile phone is provided with a storage device such as a memory, and can record the TV broadcast in the memory. The mobile phone illustrated in FIG. 21B may have a function of collecting location information, such as GPS.

An image display device such as a liquid crystal display panel or a light-emitting display panel using an organic or inorganic light-emitting element is used as the display portion 9201. The mobile phone illustrated in FIG. 21B is compact and lightweight and thus has limited battery capacity. For the above reason, a panel which can be driven with low power consumption is preferably used as a display device for the display portion 9201.

Note that although FIG. 21B illustrates the electronic device which is worn on the wrist, this embodiment is not limited thereto as long as an electronic device is portable.

Note that the structure described in this embodiment can be combined with any of the structures described in the other embodiments as appropriate.

Embodiment 12

In this embodiment, as one mode of a semiconductor device, examples of display devices each including the thin film transistor described in any of Embodiments 1 to 5 will be described with reference to FIGS. 22 to 35. In this embodiment, examples of liquid crystal display devices in each of which a liquid crystal element is used as a display element will be described with reference to FIGS. 22 to 35. The thin film transistor described in any of Embodiments 1 to 5 can be used as TFTs 628 and 629. The TFTs 628 and 629 can be manufactured through a process similar to that described in any of Embodiments 1 to 5 and have excellent electric characteristics and high reliability. The TFTs 628 and 629 are inverted staggered thin film transistors in each of which a channel formation region is formed in an oxide semiconductor layer.

First, a vertical alignment (VA) liquid crystal display device is described. The VA mode of a liquid crystal display device is a kind of mode in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Liquid crystal display devices of the multi-domain design will be described below.

Figure 22:
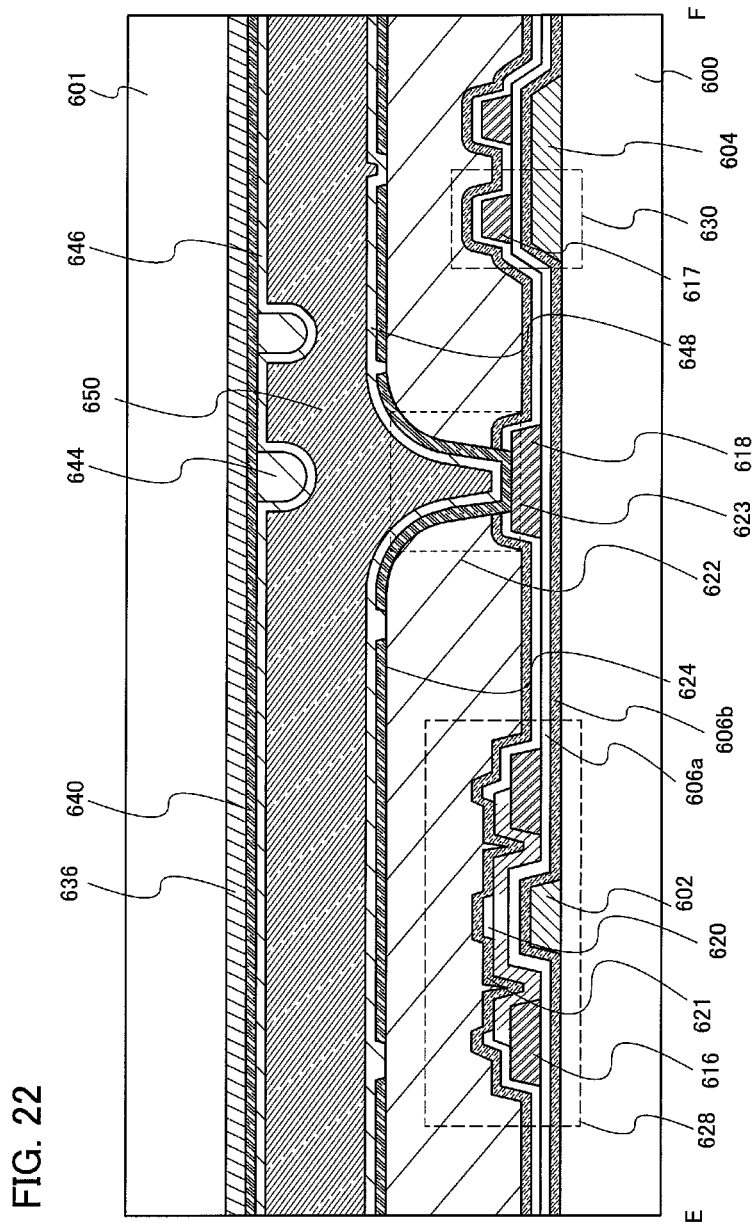
FIG. 22 illustrates a semiconductor device.
Figure 23:
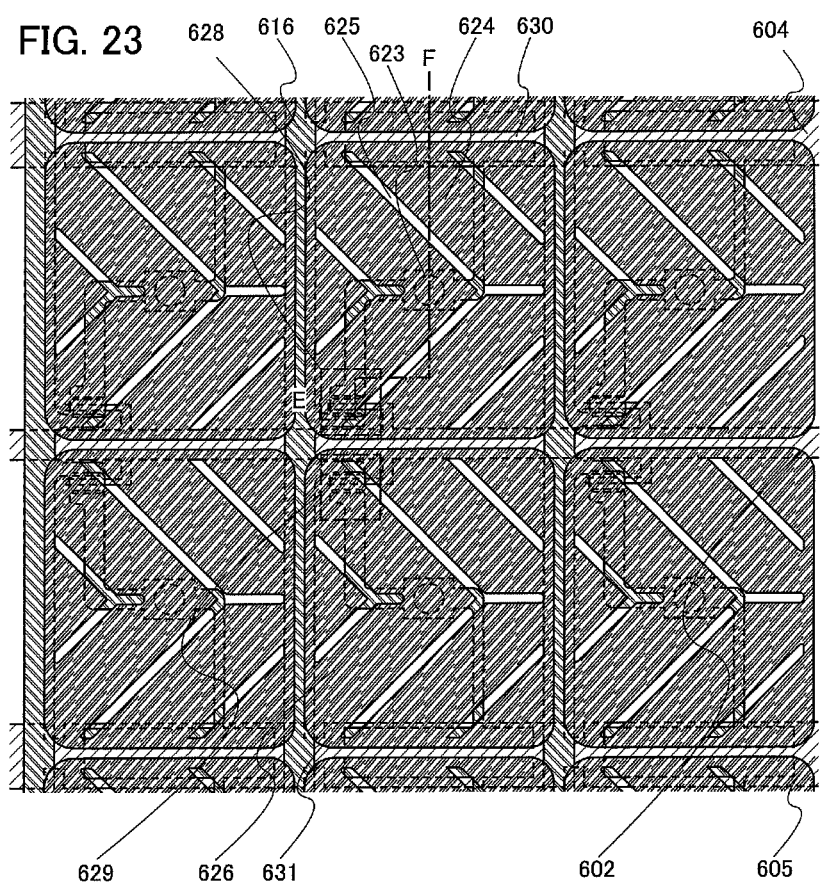
FIG. 23 illustrates a semiconductor device.
Figure 24:
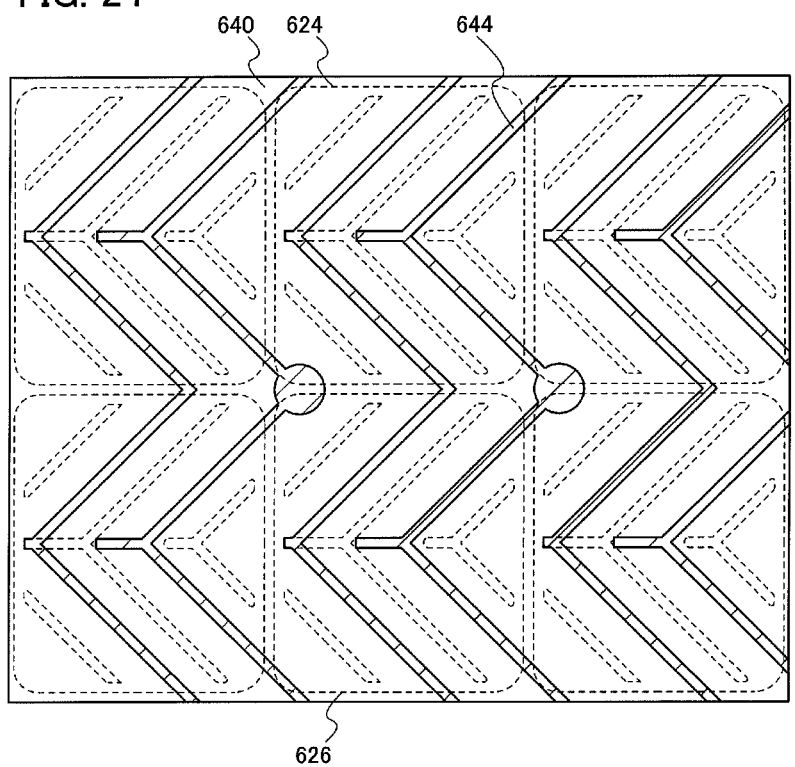
FIG. 24 illustrates a semiconductor device.

FIG. 23 and FIG. 24 illustrate a pixel electrode and a counter electrode, respectively. FIG. 23 is a plan view showing the substrate side where the pixel electrode is formed. FIG. 22 illustrates a cross-sectional structure taken along section line E-F in FIG. 23. FIG. 24 is a plan view showing the substrate side where the counter electrode is formed. Description below will be made with reference to those drawings.

In FIG. 22, a substrate 600 over which a TFT 628, a pixel electrode layer 624 connected to the TFT 628, and a storage capacitor portion 630 are formed and a counter substrate 601 on which a counter electrode layer 640 and the like are provided overlap with each other, and liquid crystal is injected between the substrate 600 and the counter substrate 601.

A coloring film 636 and the counter electrode layer 640 are provided on the counter substrate 601, and protrusions 644 are formed on the counter electrode layer 640. An alignment film 648 is formed over the pixel electrode layer 624, and an alignment film 646 is similarly formed on the counter electrode layer 640. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 which penetrates an insulating film 620 covering the TFT 628, a wiring 616, and the storage capacitor portion 630, and also penetrates an insulating film 621 covering the insulating film 620 and the insulating film 622 covering the insulating film 621. The thin film transistor described in any of Embodiments 1 to 5 can be used as the TFT 628 as appropriate. Further, the storage capacitor portion 630 includes a first capacitor wiring 604 which is formed at the same time as a gate wiring 602 of the TFT 628; a first gate insulating film 606*a*; a second gate insulating film 606*b*; and the second capacitor wiring 617 which is formed at the same time as the wirings 616 and 618.

The pixel electrode layer 624, the liquid crystal layer 650, and the counter electrode layer 640 overlap with each other, whereby a liquid crystal element is formed.

FIG. 23 illustrates a planar structure over the substrate 600. The pixel electrode layer 624 is formed using the material given in Embodiment 3. The pixel electrode layer 624 is provided with slits 625. The slits 625 are provided for controlling the alignment of the liquid crystal.

A TFT 629, a pixel electrode layer 626 connected to the TFT 629, and a storage capacitor portion 631 which are illustrated in FIG. 23 can be formed in a manner similar to the TFT 628, the pixel electrode layer 624, and the storage capacitor portion 630, respectively. Both the TFTs 628 and 629 are connected to the wiring 616. One pixel of this liquid crystal display panel includes the pixel electrode layers 624 and 626. The pixel electrode layers 624 and 626 are each included in a sub pixel.

FIG. 24 illustrates a planar structure of the counter substrate side. The counter electrode layer 640 is preferably formed using a material similar to that of the pixel electrode layer 624. The protrusions 644 which control the alignment of the liquid crystal are formed on the counter electrode layer 640. Note that in FIG. 24, the pixel electrode layers 624 and 626 formed over the substrate 600 are represented by dashed lines, and the counter electrode layer 640 and the pixel electrode layers 624 and 626 overlap with each other.

Figure 25:
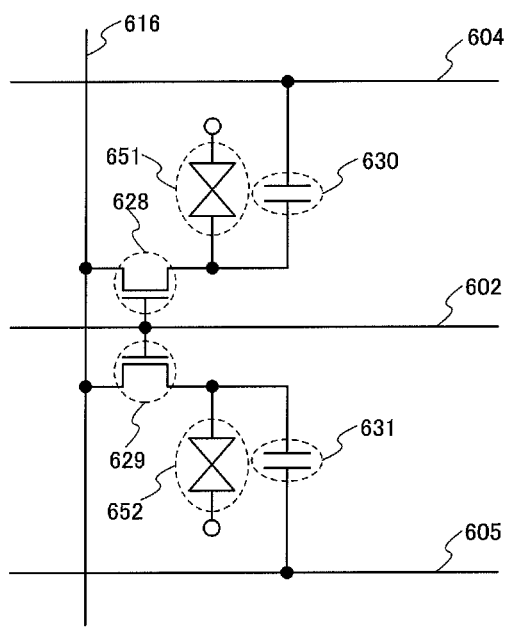
FIG. 25 illustrates a semiconductor device.

FIG. 25 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can be different from each other. In other words, the alignment of the liquid crystal is precisely controlled and a viewing angle is increased by separate control of potentials of the capacitor wirings 604 and 605.

When voltage is applied to the pixel electrode layer 624 provided with the slits 625, a distorted electric field (an oblique electric field) is generated in the vicinity of the slits 625. The protrusions 644 on the counter substrate 601 side and the slits 625 are alternately arranged with each other so that the oblique electric field is effectively generated to control the alignment of the liquid crystal, whereby the direction of the alignment of the liquid crystal varies depending on the location. In other words, a viewing angle of the liquid crystal display panel is increased by multi-domain.

Next, a VA liquid crystal display device, which is different from the above device, will be described with reference to FIG. 26 to FIG. 29.

Figure 26:
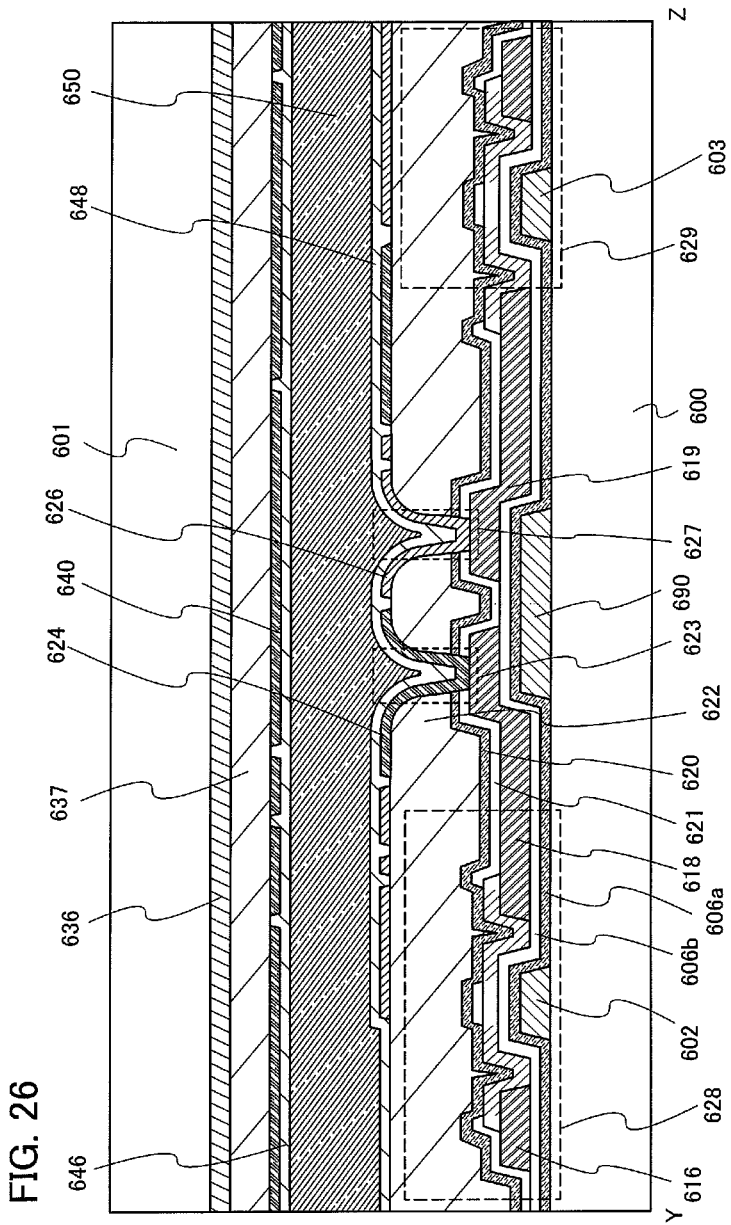
FIG. 26 illustrates a semiconductor device.
Figure 27:
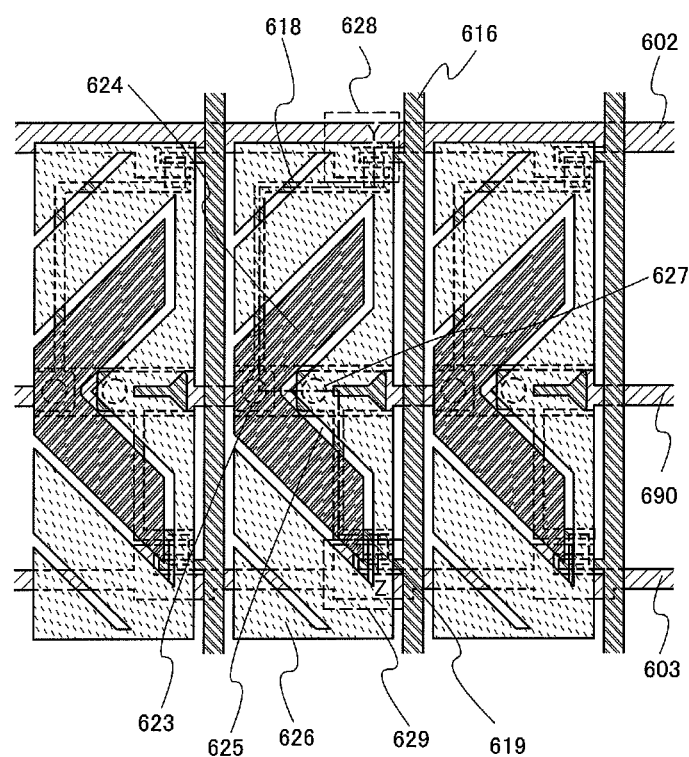
FIG. 27 illustrates a semiconductor device.

FIG. 26 and FIG. 27 illustrate a pixel structure of a VA liquid crystal display panel. FIG. 27 is a plan view of the substrate 600. FIG. 26 illustrates a cross-sectional structure taken along section line Y-Z in FIG. 27.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently of each other.

A pixel electrode layer 624 is connected to a TFT 628 via the wiring 618 through a contact hole 623 penetrating insulating films 620, 621, and 622. The pixel electrode layer 626 is connected to a TFT 629 via a wiring 619 through a contact hole 627 penetrating the insulating films 620, 621, and 622. The gate wiring 602 of the TFT 628 is separated from a gate wiring 603 of the TFT 629 so that different gate signals can be supplied. On the other hand, the wiring 616 serving as a data line is shared by the TFTs 628 and 629. The thin film transistor described in any of Embodiments 1 to 5 can be used as appropriate as the TFTs 628 and 629. Note that the first gate insulating film 606a and the second gate insulating film 606b are formed over the gate wiring 602, the gate wiring 603, and a capacitor wiring 690.

Figure 29:
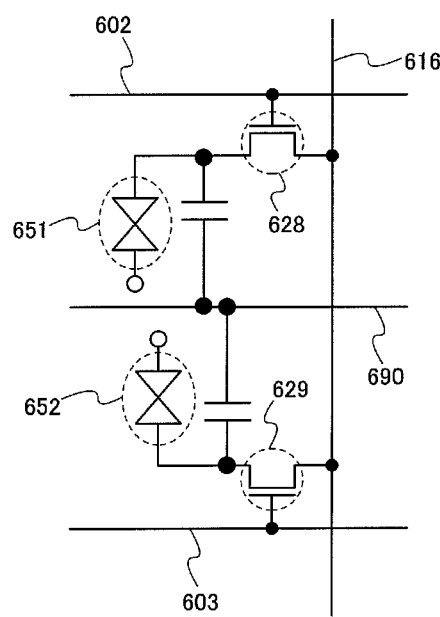
FIG. 29 illustrates a semiconductor device.

The shape of the pixel electrode layer 624 is different from that of the pixel electrode layer 626, and the pixel electrode layers are separated by slits 625. The pixel electrode layer 626 is formed so as to surround the pixel electrode layer 624 which has a V shape. Timing of voltage application to the pixel electrode layers 624 and 626 are made to be different by the TFTs 628 and 629, whereby alignment of liquid crystal is controlled. FIG. 29 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of the liquid crystal elements 651 and 652 can vary. In other words, the operations of the TFTs 628 and 629 are controlled separately to precisely control the alignment of the liquid crystal in the liquid crystal elements 651 and 652, which leads to a wider viewing angle.

Figure 28:
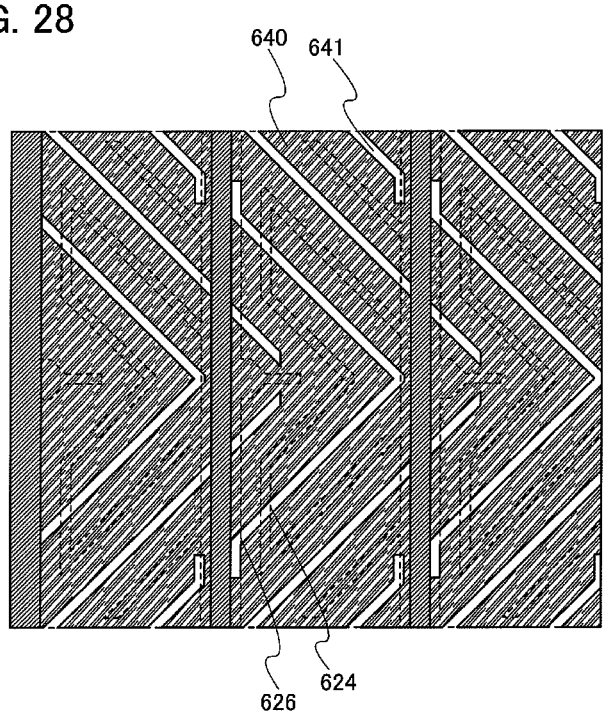
FIG. 28 illustrates a semiconductor device.

The counter substrate 601 is provided with the coloring film 636 and the counter electrode layer 640. A planarization film 637 is formed between the coloring film 636 and the counter electrode layer 640 to prevent alignment disorder of the liquid crystal. FIG. 28 illustrates a structure of the counter substrate side. The counter electrode layer 640 is an electrode shared by different pixels and has slits 641. The slits 641 and the slits 625 on the pixel electrode layer 624 and 626 sides are alternately arranged with each other so that an oblique electric field is effectively generated, whereby the alignment of the liquid crystal can be controlled. Accordingly, the alignment of the liquid crystal can vary depending on the location, which leads to a wider viewing angle. Note that in FIG. 28, the pixel electrode layers 624 and 626 over the substrate 600 are represented by dashed lines and the counter electrode layer 640 and the pixel electrode layers 624 and 626 overlap with each other.

The alignment film 648 is formed over the pixel electrode layer 624 and the pixel electrode layer 626, and the counter electrode layer 640 is also provided with the alignment film 646. The liquid crystal layer 650 is formed between the substrate 600 and the counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIG. 26 to FIG. 29 is a multi-domain structure in which the first liquid crystal element and the second liquid crystal element are provided in one pixel.

Next, a liquid crystal display device in a horizontal electric field mode will be described. In the horizontal electric field mode, an electric field in a horizontal direction is applied to liquid crystal molecules in a cell, whereby liquid crystal is driven to express a gray scale. With this method, a viewing angle can be increased to about 180°. A liquid crystal display device in the horizontal electric field mode will be described below.

Figure 30:
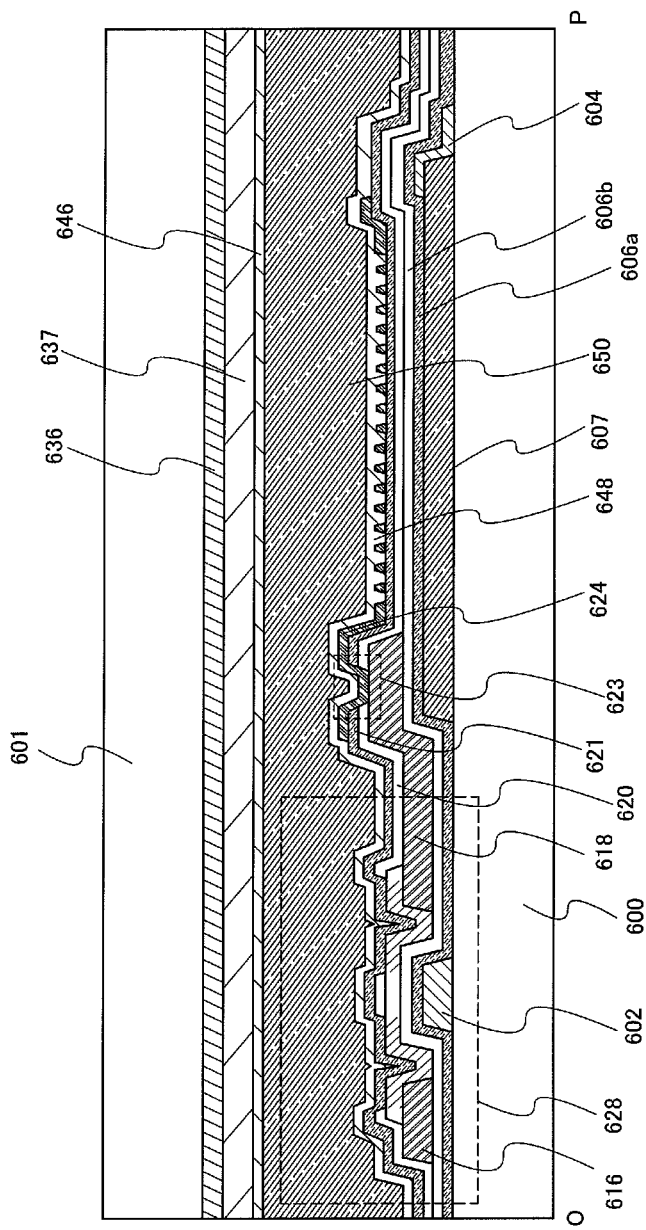
FIG. 30 illustrates a semiconductor device.

In FIG. 30, the substrate 600 over which an electrode layer 607, the TFT 628, and the pixel electrode layer 624 connected to the TFT 628 are formed overlaps with the counter substrate 601, and liquid crystal is injected between the substrate 600 and the counter substrate 601. The counter substrate 601 is provided with the coloring film 636, the planarization film 637, and the like. Note that a counter electrode is not provided on the counter substrate 601. In addition, the liquid crystal layer 650 is formed between the substrate 600 and the counter substrate 601 and the alignment films 646 and 648 are provided between the liquid crystal layer 650 and the substrate 600 and the counter substrate 601.

The electrode layer 607 and the capacitor wiring 604 connected to the electrode layer 607, and the TFT 628 are formed over the substrate 600. The capacitor wiring 604 can be formed at the same time as the gate wiring 602 of the TFT 628. The thin film transistor described in any of Embodiments 1 to 5 can be used as the TFT 628. The electrode layer 607 can be formed of a material similar to that of the pixel electrode layer 227 described in Embodiment 3. The electrode layer 607 is divided almost in a pixel form. Note that the gate insulating film 606a and the second gate insulating film 606b are formed over the electrode layer 607 and the capacitor wiring 604.

The wirings 616 and 618 of the TFT 628 are formed over the first gate insulating film 606a and the second gate insulating film 606b. The wiring 616 is a data line through which a video signal travels and is a wiring extending in one direction in a liquid crystal display panel. The wiring 616 is also connected to a source or drain region of the TFT 628, and serves as one of source and drain electrodes. The wiring 618 serves as the other of the source and drain electrodes and is connected to the pixel electrode layer 624.

The insulating film 620 and the insulating film 621 are formed over the wirings 616 and 618. Over the insulating film 620, the pixel electrode layer 624 which is connected to the wiring 618 through a contact hole formed in the insulating film 620 and the insulating film 621 is formed. The pixel electrode layer 624 is formed of a material similar to that of the pixel electrode layer 227 described in Embodiment 3.

In such a manner, the TFT 628 and the pixel electrode layer 624 connected to the TFT 628 are formed over the substrate 600. Note that a storage capacitor is formed with the electrode layer 607, the gate insulating films 606a and 606b, the insulating film 620, and the pixel electrode layer 624.

Figure 31:
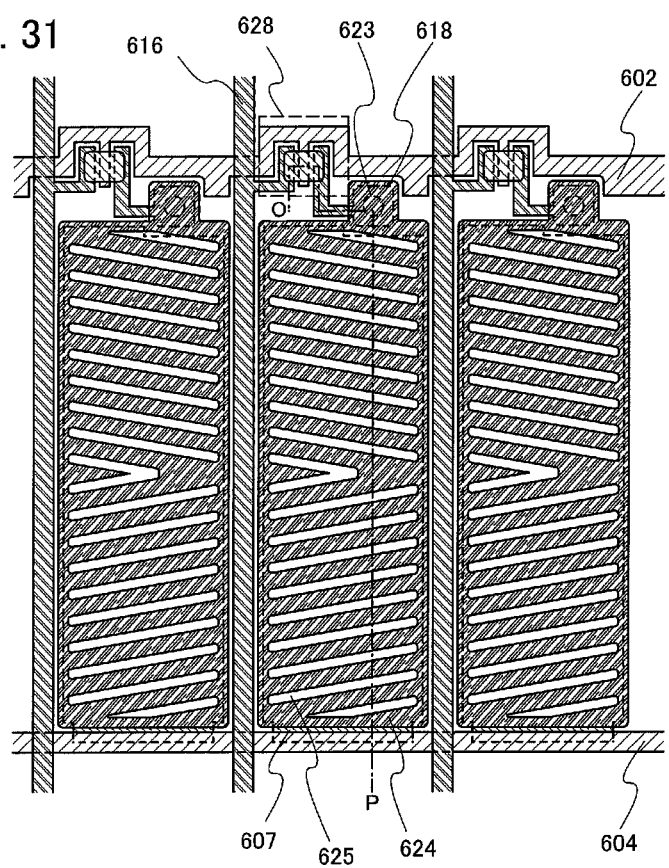
FIG. 31 illustrates a semiconductor device.

FIG. 31 is a plan view illustrating a structure of the pixel electrode. FIG. 30 illustrates a cross-sectional structure taken along section line O-P in FIG. 31. The pixel electrode layer 624 is provided with slits 625. The slits 625 are provided for controlling alignment of liquid crystal. In that case, an electric field is generated between the electrode layer 607 and the pixel electrode layer 624. The thickness of the first gate insulating film 606a and the second gate insulating film 606b formed between the electrode layer 607 and the pixel electrode layer 624 is 50 nm to 200 nm, which is much smaller than the thickness of the liquid crystal layer which is 2 µm to 10 µm. Thus, an electric field is generated substantially in parallel (in a horizontal direction) to the substrate 600. The alignment of the liquid crystal is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, an aperture ratio can be improved.

Next, a different example of the liquid crystal display device in the horizontal electric field mode will be described.

Figure 32:
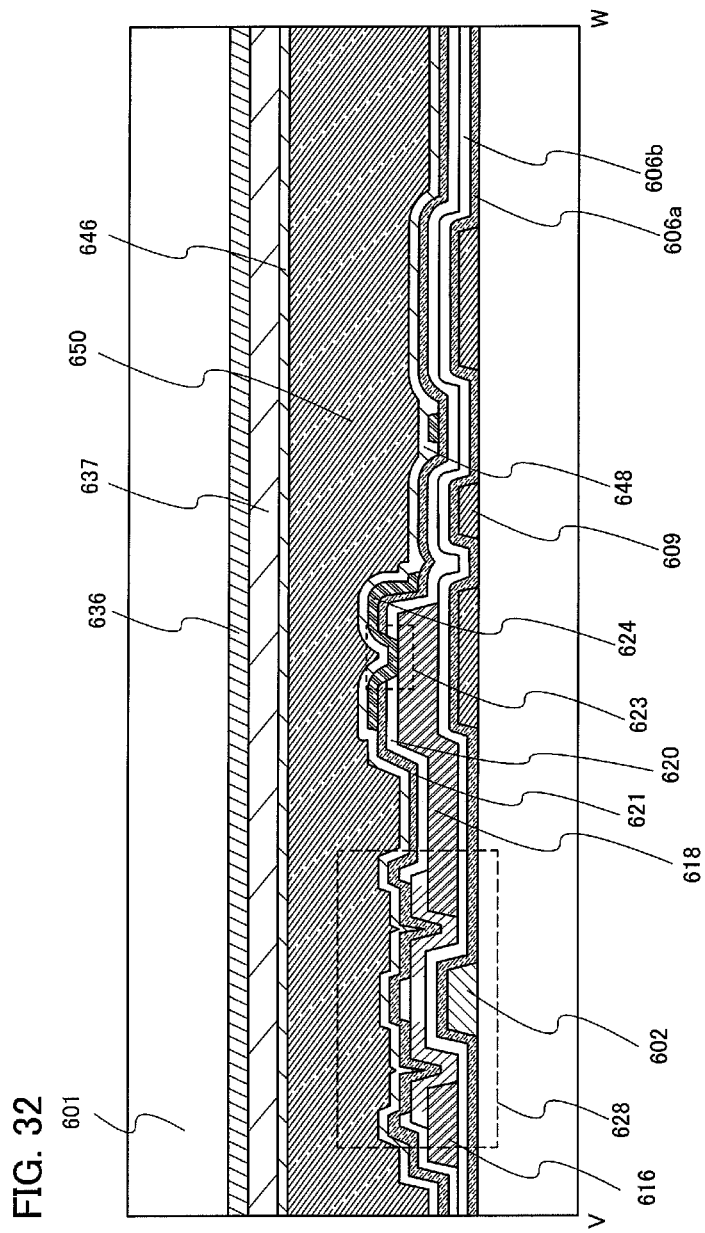
FIG. 32 illustrates a semiconductor device.
Figure 33:
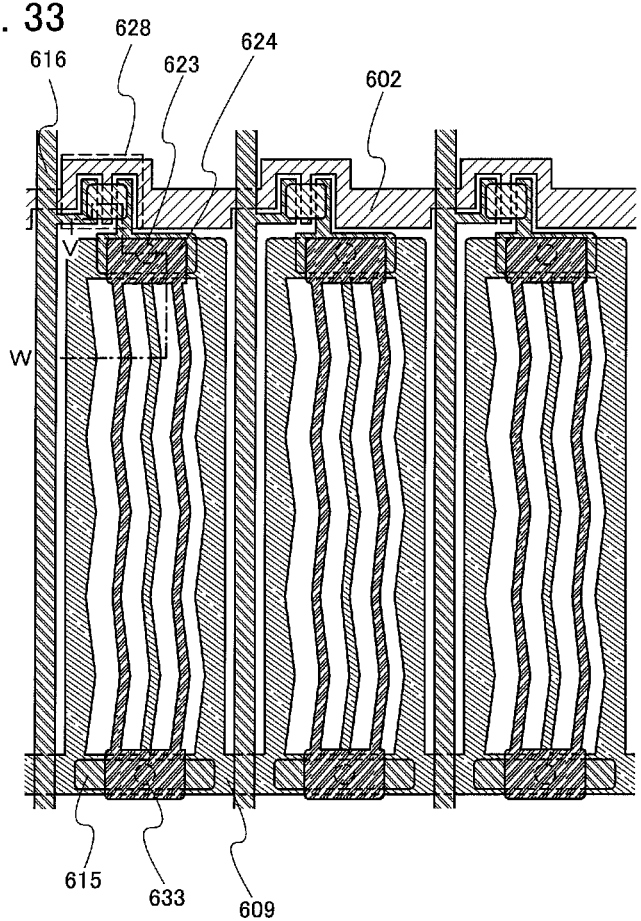
FIG. 33 illustrates a semiconductor device.

FIG. 32 and FIG. 33 illustrate a pixel structure of a liquid crystal display device in an IPS mode. FIG. 33 is a plan view. FIG. 32 illustrates a cross-sectional structure taken along section line V-W in FIG. 33. Description below will be given with reference to both the drawings.

In FIG. 32, the substrate 600 over which the TFT 628 and the pixel electrode layer 624 connected to the TFT 628 are formed overlaps with the counter substrate 601, and liquid crystal is injected between the substrate 600 and the counter substrate 601. The counter substrate 601 is provided with the coloring film 636, the planarization film 637, and the like. Note that a counter electrode is not provided on the counter substrate 601. The liquid crystal layer 650 is formed between the substrate 600 and the counter substrate 601 and the alignment films 646 and 648 are provided between the liquid crystal layer 650 and the substrate 600 and the counter substrate 601.

A common potential line 609 and the TFT 628 are formed over the substrate 600. The common potential line 609 can be formed at the same time as the gate wiring 602 of the TFT 628. The thin film transistor described in any of Embodiments 1 to 5 can be used as the TFT 628.

The wirings 616 and 618 of the TFT 628 are formed over the first gate insulating film 606a and the second gate insulating film 606b. The wiring 616 is a data line through which a video signal travels and is a wiring extending in one direction in a liquid crystal display panel. The wiring 616 is also connected to a source or drain region of the TFT 628, and serves as one of source and drain electrodes. The wiring 618 serves as the other of the source and drain electrodes and is connected to the pixel electrode layer 624.

The insulating film 620 and the insulating film 621 are formed over the wirings 616 and 618. Over the insulating film 620 and the insulating film 621, the pixel electrode layer 624 which is connected to the wiring 618 through a contact hole 623 formed in the insulating film 620 and the insulating film 621 is formed. The pixel electrode layer 624 is formed of a material similar to that of the pixel electrode layer 227 described in Embodiment 3. Note that as illustrated in FIG. 33, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged with each other.

The alignment of the liquid crystal is controlled by an electric field generated due to a potential applied to the pixel electrode layer 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. The first gate insulating film 606a and the second gate insulating film 606b are provided between the common potential line 609 and a capacitor electrode 615 to form a storage capacitor. The capacitor electrode 615 and the pixel electrode layer 624 are connected to each other through a contact hole 633.

Next, a mode of a liquid crystal display device in a TN mode will be described.

Figure 34:
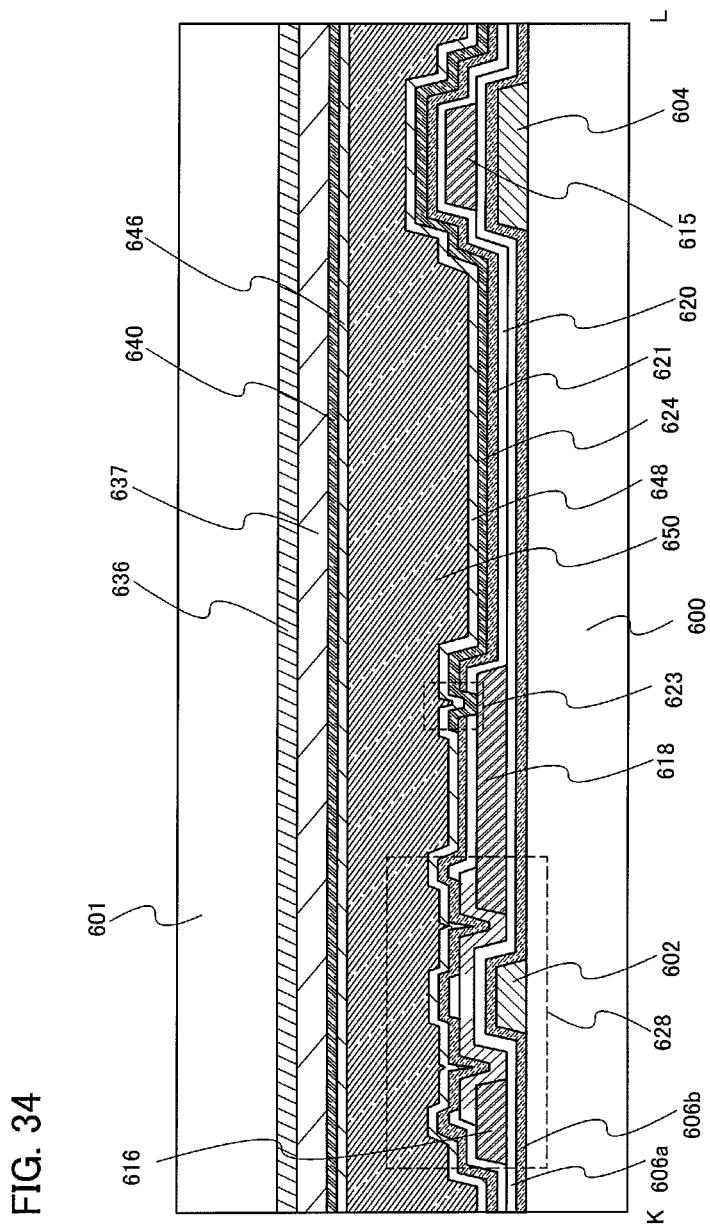
FIG. 34 illustrates a semiconductor device.
Figure 35:
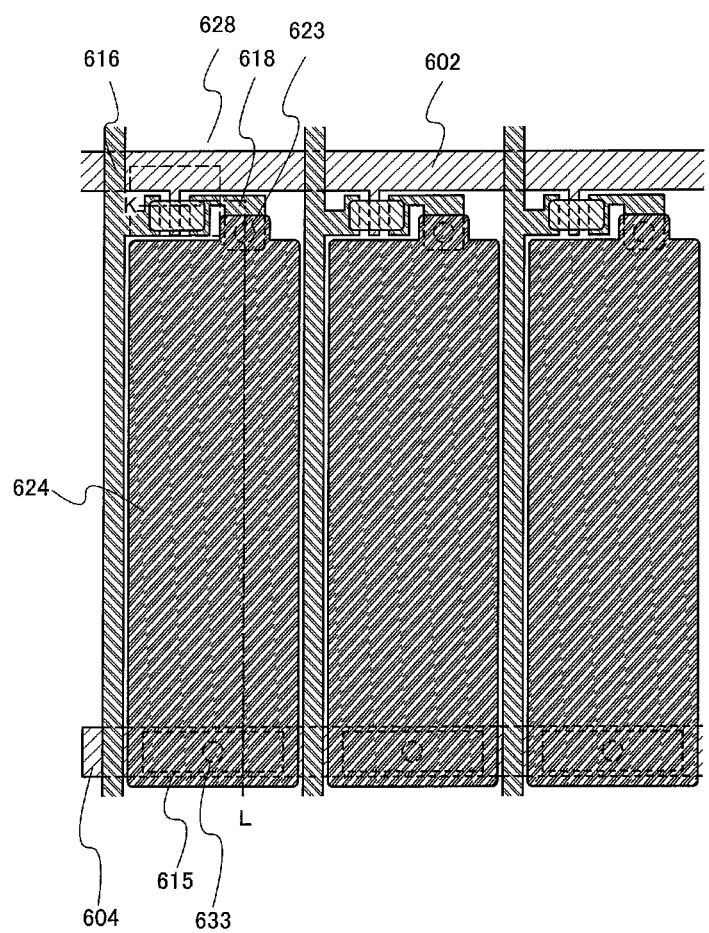
FIG. 35 illustrates a semiconductor device.

FIG. 34 and FIG. 35 illustrate a pixel structure of a liquid crystal display device in a TN mode. FIG. 35 is a plan view. FIG. 34 illustrates a cross-sectional structure taken along section line K-L in FIG. 35. Description below will be given with reference to both the drawings.

The pixel electrode layer 624 is connected to the TFT 628 via a wiring 618 and through the contact hole 623 formed in the insulating films 620 and 621. The wiring 616 serving as a data line is connected to the TFT 628. The TFT described in any of Embodiments 1 to 5 can be used as the TFT 628.

The pixel electrode layer 624 is formed using the pixel electrode layer 227 described in Embodiment 3. The capacitor wiring 604 can be formed at the same time as the gate wiring 602 of the TFT 628. The first gate insulating film 606a and the second gate insulating film 606b are formed over the gate wiring 602 and the capacitor wiring 604. A storage capacitor is formed with the capacitor wiring 604, a capacitor electrode 615, and the first gate insulating film 606a and the second gate insulating film 606b therebetween. The capacitor electrode 615 and the pixel electrode layer 624 are connected to each other through the contact hole 633.

The counter substrate 601 is provided with the coloring film 636 and the counter electrode layer 640. The planarization film 637 is formed between the coloring film 636 and the counter electrode layer 640 to prevent alignment disorder of liquid crystal. The liquid crystal layer 650 is formed between the pixel electrode layer 624 and the counter electrode layer 640 and the alignment films 646 and 648 are provided between the liquid crystal layer 650 and the pixel electrode layer 624 and the counter electrode layer 640.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is opposite to the surface provided with the thin film transistor, and a polarizing plate is attached to a surface of the counter substrate 601, which is opposite to the surface provided with the counter electrode layer 640.

As described above, a highly reliable liquid crystal display device can be provided by using a bottom-gate thin film transistor in which a source electrode layer and a drain electrode layer are formed in such a manner that they do not overlap with a gate electrode layer to sufficiently reduce parasitic capacitance.

Note that the structure described in this embodiment can be combined with any of the structures described in the other embodiments as appropriate.

This application is based on Japanese Patent Application serial no. 2009-180156 filed with Japan Patent Office on Jul. 31, 2009, the entire contents of which are hereby incorporated by reference.

The invention claimed is:

1. A semiconductor device comprising:
a gate electrode layer over an insulating surface;
a gate insulating layer over the gate electrode layer;
a source electrode layer and a drain electrode layer over the gate insulating layer;
an oxide semiconductor layer over the gate insulating layer and overlapping above parts of the source electrode layer and the drain electrode layer; and
an oxide insulating layer over the oxide semiconductor layer,
wherein the oxide semiconductor layer includes a channel formation region over the gate electrode layer,
wherein the source electrode layer and the drain electrode layer do not overlap with the gate electrode layer,
wherein side surfaces of the source electrode layer and the drain electrode layer are in contact with parts of the oxide semiconductor layer, and
wherein the oxide insulating layer is in contact with the channel formation region in the oxide semiconductor layer.

2. The semiconductor device according to claim 1, wherein the oxide insulating layer covers opposite ends of the oxide semiconductor layer in a channel length direction.

3. The semiconductor device according to claim 1, wherein the oxide insulating layer covers outer end portions of the source electrode layer and the drain electrode layer in a channel length direction.

4. The semiconductor device according to claim 1, wherein each of the source electrode layer and the drain electrode layer comprises a film including an element selected from Al, Cr, Cu, Ta, Ti, Mo, and W as a main component, or a stacked-layer structure including films thereof.

5. The semiconductor device according to claim 1, wherein each of the source electrode layer and the drain electrode layer comprises indium oxide, an indium oxide-tin oxide alloy, an indium oxide-zinc oxide alloy, or zinc oxide.

6. The semiconductor device according to claim 1, wherein a width of the channel formation region in a channel length direction is smaller than a width of the gate electrode layer in the channel length direction.

7. The semiconductor device according to claim 1, wherein the oxide insulating layer comprises a silicon oxide film, an aluminum oxide film, or an aluminum oxynitride film.

8. A semiconductor device comprising:
a gate electrode layer over an insulating surface;
a gate insulating layer over the gate electrode layer;
a source electrode layer and a drain electrode layer over the gate insulating layer;
an oxide semiconductor layer over the gate insulating layer and overlapping above parts of the source electrode layer and the drain electrode layer;
an oxide insulating layer over the oxide semiconductor layer; and
a protective insulating layer over the oxide insulating layer and the oxide semiconductor layer,
wherein the oxide semiconductor layer includes a channel formation region over the gate electrode layer,
wherein the source electrode layer and the drain electrode layer do not overlap with the gate electrode layer,
wherein side surfaces of the source electrode layer and the drain electrode layer are in contact with parts of the oxide semiconductor layer,
wherein the oxide insulating layer is in contact with the channel formation region in the oxide semiconductor layer, and
wherein the protective insulating layer is in contact with part of a top surface of the oxide semiconductor layer.

9. The semiconductor device according to claim 8, wherein the oxide insulating layer covers opposite ends of the oxide semiconductor layer in a channel length direction.

10. The semiconductor device according to claim 8, wherein the oxide insulating layer covers outer end portions of the source electrode layer and the drain electrode layer in a channel length direction.

11. The semiconductor device according to claim 8, wherein each of the source electrode layer and the drain electrode layer comprises a film including an element selected from Al, Cr, Cu, Ta, Ti, Mo, and W as a main component, or a stacked-layer structure including films thereof.

12. The semiconductor device according to claim 8, wherein each of the source electrode layer and the drain electrode layer comprises indium oxide, an indium oxide-tin oxide alloy, an indium oxide-zinc oxide alloy, or zinc oxide.

13. The semiconductor device according to claim 8,
wherein a width of the channel formation region in a channel length direction is smaller than a width of the gate electrode layer in the channel length direction.

14. The semiconductor device according to claim 8,
wherein the oxide insulating layer comprises a silicon oxide film, an aluminum oxide film, or an aluminum oxynitride film.

15. The semiconductor device according to claim 8,
wherein the protective insulating layer comprises a silicon nitride film or an aluminum nitride film.

16. A semiconductor device comprising:
a gate electrode layer over an insulating surface;
a gate insulating layer over the gate electrode layer;
a source electrode layer and a drain electrode layer over the gate insulating layer;
an oxide semiconductor layer over the gate insulating layer so as to be in contact with the source electrode layer and the drain electrode layer;
an oxide insulating layer over the oxide semiconductor layer; and
a protective insulating layer over the oxide insulating layer and the oxide semiconductor layer,
wherein the oxide semiconductor layer includes a channel formation region over the gate electrode layer,
wherein the source electrode layer and the drain electrode layer do not overlap with the gate electrode layer,
wherein the oxide insulating layer is in contact with the channel formation region in the oxide semiconductor layer, and
wherein the oxide insulating layer has an opening so as to expose parts of the oxide semiconductor layer.

17. The semiconductor device according to claim 16,
wherein the oxide insulating layer covers opposite ends of the oxide semiconductor layer in a channel length direction.

18. The semiconductor device according to claim 16,
wherein the oxide insulating layer covers outer end portions of the source electrode layer and the drain electrode layer in a channel length direction.

19. The semiconductor device according to claim 16,
wherein each of the source electrode layer and the drain electrode layer comprises a film including an element selected from Al, Cr, Cu, Ta, Ti, Mo, and W as a main component, or a stacked-layer structure including films thereof.

20. The semiconductor device according to claim 16,
wherein each of the source electrode layer and the drain electrode layer comprises indium oxide, an indium oxide-tin oxide alloy, an indium oxide-zinc oxide alloy, or zinc oxide.

21. The semiconductor device according to claim 16,
wherein a width of the channel formation region in a channel length direction is smaller than a width of the gate electrode layer in the channel length direction.

22. The semiconductor device according to claim 16,
wherein the oxide insulating layer comprises a silicon oxide film, an aluminum oxide film, or an aluminum oxynitride film.

23. The semiconductor device according to claim 16,
wherein the protective insulating layer comprises a silicon nitride film or an aluminum nitride film.

\* \* \* \* \*